United States Patent [19]
Meyers

[11] Patent Number: 5,822,125
[45] Date of Patent: Oct. 13, 1998

[54] LENSLET ARRAY SYSTEM

[75] Inventor: Mark M. Meyers, Hamlin, N.Y.

[73] Assignee: Eastman Kodak Company, Rochester, N.Y.

[21] Appl. No.: 772,590

[22] Filed: Dec. 20, 1996

[51] Int. Cl.⁶ ............................................. G02B 27/10
[52] U.S. Cl. ........................ 359/621; 359/622; 359/626
[58] Field of Search ............................... 359/621, 622, 359/623, 624, 619, 626

[56] References Cited

U.S. PATENT DOCUMENTS

| | | | |
|---|---|---|---|
| 4,632,522 | 12/1986 | Ishitani | 359/432 |
| 4,988,188 | 1/1991 | Ohta | 353/122 |
| 5,101,279 | 3/1992 | Kurematsu et al. | 358/241 |
| 5,270,859 | 12/1993 | Wirth et al. | 359/655 |
| 5,291,334 | 3/1994 | Wirth et al. | 359/622 |
| 5,463,498 | 10/1995 | Gal et al. | 359/622 |
| 5,465,175 | 11/1995 | Woodgate et al. | 359/463 |
| 5,550,656 | 8/1996 | Sprague et al. | 359/40 |
| 5,612,821 | 3/1997 | Schmutz | 359/622 |
| 5,615,048 | 3/1997 | Davies et al. | 359/622 |
| 5,636,056 | 6/1997 | Itonaga et al. | 359/601 |
| 5,648,874 | 7/1997 | Sawaki et al. | 359/622 |
| 5,650,876 | 7/1997 | Davies et al. | 359/622 |

*Primary Examiner*—David C. Nelms
*Assistant Examiner*—Ricky Mack
*Attorney, Agent, or Firm*—Svetlana Z. Short

[57] ABSTRACT

A lenslet array system includes (i) a first assembly including a field-limiting mask and a first lenslet array having an associated focal plane and (ii) a second assembly including a second lenslet array accepting light from the first assembly. The first lenslet array accepts a full field of view in excess of 20 degrees and forms a plurality of image sections of the associated object on an intermediate image plane which is substantially coplanar with the focal plane associated with the first lenslet array. The first lenslet array includes a plurality of positive power lenslets. Each of the plurality of lenslets has a focal length $f_1$ of less than 15 mm and accepts a unique segment of the full field of view subtended by the associated object. These segments of the full field of view together comprise the full field of view, and each of said lenslets forms one image section corresponding to its segment of the full field of view. The second lenslet array of the second assembly accepts light from the first assembly. The second lenslet array has a plurality of positive power lenslets. Each of the lenslets of the second lenslet array (a) has a focal length $f_2$ which is less than 15 mm, (b) reimages one of the image sections located at the intermediate image plane and creates an inverted real image of this image section on the final image surface, and (c) together with other lenslets of the second lenslet array creates a single image of the associated object.

31 Claims, 18 Drawing Sheets

LENSLET ARRAY SYSTEM

CROSS REFERENCE TO RELATED APPLICATIONS

This application is related to the following commonly assigned applications:

(1.) U.S. Ser. No. 08/771,592, filed concurrently herewith by Mark M. Meyers for A LENSLET ARRAY SYSTEM INCORPORATING AN INTEGRAL FIELD LENS/REIMAGER LENSLET ARRAY (Docket 74959SZS);

(2.) U.S. Ser. No. 08/771,745, filed concurrently herewith by Mark M. Meyers for A LENSLET ARRAY SYSTEM INCORPORATING A FIELD LENSLET ARRAY (Docket 74961SZS);

(3.) U.S. Ser. No. 08/771,123, filed concurrently herewith by Mark M. Meyers for A LENSLET ARRAY SYSTEM WITH A BAFFLE STRUCTURE AND A SHUTTER (Docket 74975SZS);

(4.) U.S. Ser. No. 08/652,735, filed May 23, 1996 by Mark M. Meyers for A DIFFRACTIVE/REFRACTIVE LENSLET ARRAY; and (5.) U.S. Ser. No. 08/663,887, filed Jun. 14, 1996 by Mark M. Meyers for A DIFFRACTIVE/REFRACTIVE LENSLET ARRAY INCORPORATING A SECOND ASPHERIC SURFACE.

BACKGROUND OF THE INVENTION

1. Field of the Invention

This invention relates to compact, short focal length lens systems incorporating a plurality of lenslet arrays. Although not limited thereto, it is particularly suitable for use with photographic or digital cameras, as well as digital camcoders.

2. Background Art

It is desirable to produce very compact cameras. In order to produce a compact camera one needs to produce a very compact taking lens system (also referred to as objective lens ). Compactness of a lens system is defined by its total length—i.e., by how small is the distance from the front vertex of the lens system's front-most lens surface to the lens system's image plane. This distance often depends on the lens system's focal length. That is, as the focal length of the lens system gets smaller, the lens system becomes more compact; However, in a conventional lens system the size of the image format is determined by only two parameters—the focal length FL of the lens system and the field angle θ. This is illustrated in FIG. 1. These two parameters are related by the following equation $$h = FL \times \operatorname{Tan}(\theta/2),$$

where h is the semi diagonal of the required format (also referred to as the image height) and is the θ/2 half field angle.

Thus, in order to maintain the same image format (i.e., in order to maintain a given image height h), if the focal length of the lens system is decreased, the lens system needs to process a larger field of view. However, as the field of view becomes larger, certain lens aberration become difficult to correct. For example, when the half field of view θ/2 is larger than 30–35 degrees, coma, astigmatism and field curvature become predominate aberrations and adversely affect the image quality. A conventional lens system cannot achieve compactness, provide an acceptable image quality, have a small focal length and accommodate a large field of view. The desire to keep the focal length small conflicts with the desire to keep the field of view from getting too large.

Lenslet arrays are known to exist in nature. The eyes of a fly, for example, incorporate an array of minute lens elements (also referred to as lenslets). The fly's eye lens arrangement is used for generating masks for photo-etching. This has been described in section 21, page 1236 of "SPSE HANDBOOK OF PHOTOGRAPHIC SCIENCE" published by John Wiley and Sons.

Lenslet arrays have been also used for other purposes. U.S. Pat. No. 5,351,151 discloses a dual lenslet array transflector for combined spatial and spectral filtering applications. In this transflector, the focal planes of two arrays coincide. Therefore, a collimated beam incident on the first lenslet array will exit the second lenslet array also as a collimated light beam and, thus, will not form an image. Similarly, a nearly collimated incoming beam will exit the second lenslet array as a nearly collimated beam. In addition, this patent (Col. 7) teaches that the light beams comings out of the second array are scrambled with respect to one another and need further optics for unscrambling. Finally, this patent teaches that for an object located a long distance away, no real final image is being formed, and the final image is a virtual image. (Col. 5, ln. 67) That is, the exiting rays diverge rather than converge. Therefore, if a photosensitive medium is placed behind second array, no image will be crated on the photosensitive medium.

U.S. Pat. Nos. 4,739,416 and 4,632,522 describe a lens assembly for use in a photocopier apparatus. The lens assembly disclosed in U.S. Pat. No. 4,632,522 comprises two lenslet arrays configured to reimage a closely located object onto an associated image plane (referred to as a screen). The focal plane of the first lenslet array is located about half way between first lenslet array and the intermediate image plane of the image sections (320, 310, 300). Because the second lenslet array is configured to reimage an object lying in the above mentioned intermediate image plane, anything located in the vicinity of the focal plane of the first array will not be reimaged properly by the second lenslet array. Thus, this lens assembly is not capable of imaging a distant object on the final image plane (i.e., the screen 4). In addition, adjacent lenslets will see portions of the same field of view. This will result in a plurality of offset, partially overlapping images. This is completely unsuitable in a camera application.

Assemblies of two lenslet arrays have been used in the beam steering optics. Such assemblies are described in U.S. Pat. Nos. 5,059,008 and 5,015,080. The lenslets of these arrays are not designed to look at different portions of a field of view. Rather, lenslet array assemblies are configured to produce a collimated beam of light exiting the optical system at variable exit angles. These lenslet array assemblies do not create images and thus are not suitable for use in an image forming system.

SUMMARY OF THE INVENTION

It is an object of the present invention to provide a very compact, easily manufacturable, short focal length lenslet array system with an excellent image quality over a large field of view.

According to the present invention, a lenslet array system includes (i) a first assembly including a field-limiting mask and a first lenslet array having an associated focal plane and (ii) a second assembly including a second lenslet array accepting light from the first assembly. The first lenslet array accepts a full field of view in excess of 20 degrees and forms a plurality of image sections of the associated object on an intermediate image plane which is substantially coplanar with the focal plane associated with the first lenslet array. The first lenslet array includes a plurality of positive power lenslets. Each of the plurality of lenslets has a focal length $f_1$ of less than 15 mm and accepts a unique segment of the full field of view subtended by the associated object. These segments of the full field of view together comprise the full field of view, and each of said lenslets forms one image section corresponding to its segment of the full field of view. The second lenslet array of the second assembly accepts light from the first assembly. The second lenslet array has a plurality of positive power lenslets. Each of the lenslets of the second lenslet array (a) has a focal length $f_2$ which is less than 15 mm, (b) reimages one of the image sections located at the intermediate image plane and creates an inverted real image of this image section on the final image surface, and (c) together with other lenslets of the second lenslet array creates a single image of the associated object. According to a preferred embodiment of the present invention the focal length $f_2$ is smaller than the focal length $f_1$ and the single image is a continuous image.

Also according to the preferred embodiment of the present invention the first lenslet array and the second lenslet array in combination provide a lenslet array system having a total length of less than 17 millimeters.

Also according to the preferred embodiment, the lenslet array system satisfies a ratio $1.0 < f_1/f_2 < 7.0$.

Also according to the preferred embodiment the second lenslet array is located a distance equal to or larger than 1.2 $f_2$ from the intermediate image plane.

It is an advantage of the present invention that the lenslet array system is compact, has a small focal length and is capable of imaging over a large field of view.

BRIEF DESCRIPTION OF THE DRAWINGS

To facilitate understanding, identical reference numerals have been used, where possible, to designate identical elements that are common to the figures.

DESCRIPTION OF THE PREFERRED EMBODIMENT

I. Lenslet array system description.

Figure 1:
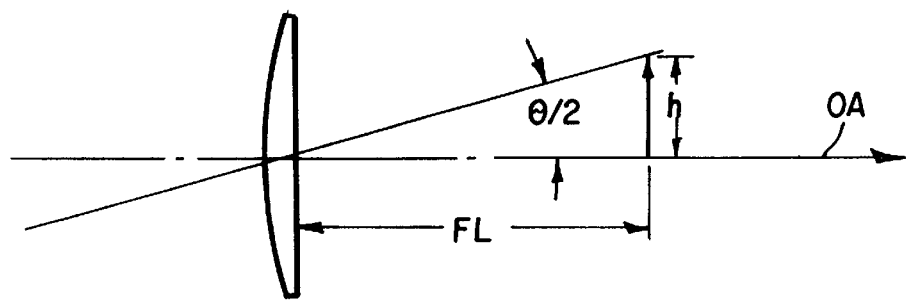
FIG. 1 illustrates a prior art optical system.
Figure 2:
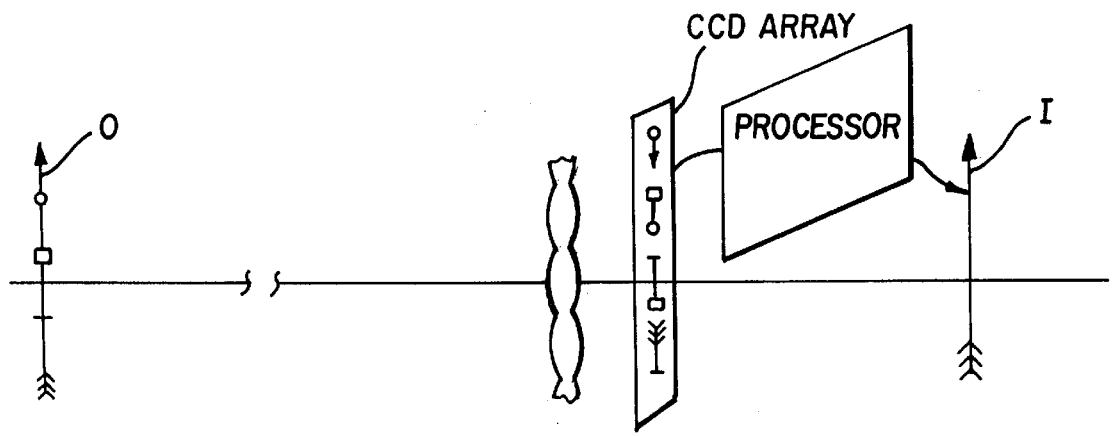
FIG. 2 schematically illustrates an optical system disclosed in a related application.

A new and promising approach in digital cameras using a novel lenslet array/CCD array combination is described in related application Ser. Nos. 08/652,735 and 08/663,887. These lenslet arrays create a multitude of image sections of an extended object O. These image sections are not oriented properly with respect to one another. That is, the plurality of lenslets of a given lenslet array create an overall image which is both discontinuous and "scrambled" such that top and bottom portions of these image sections do not correspond to one another (See FIG. 2). The image sections are located at a plane containing a CCD array. The image information represented by these image sections is accepted by a CCD array and is processed, creating a final, "unscrambled" image I for display. Because the overall image created on the plane containing a CCD array is scrambled, it is not suitable for direct viewing or for film photography. It may not be used in digital cameras without ether a special CCD array and/or without further processing.

The lenslet array system 1 of the present invention creates an image I of an extended object O. The lenslet array system 1 is capable of accepting a wide field of view (at least ±30 and preferably ±35 or more degrees). However, this lenslet array system may be beneficial for use in systems accepting a ±10° (or larger) field of view. The lenslet array system 1 is described in more detail as embodiments 100, 200, 300, 400. The lenslet array system 1 and comprises a field limiting structure and two or more lenslet arrays 10 shown in FIG. 3.

One of the lenslet arrays 10 functions as an imaging lens and is called an imaging lenslet array and the other lenslet array 10 functions as a relay lens (i.e., reimaging lens) and is called a reimaging lenslet array. Each lenslet array 10 comprises a plurality (over 4) of small lens elements 12 (also referred herein as lenslets). Each lenslet array 10 may contain tens, hundreds, thousands or millions of lenslets 12.

The total length of the lenslet array system 1 is measured from the front most lens array surface to the final image plane. It is preferred that the total length of the lenslet array system is less than 17 mm and preferably less than 12 mm, and more preferably less than 8 mm and most preferably less than 5 mm. This allows for the fabrication of extremely compact photographic and digital cameras, as well as video camcoders.

The optical powers of the lenslets 12 of lenslet arrays 10 are being such that the lenslet array system has a focal length that is less than 15 mm, and preferably between about 0.5 and 15 millimeters. Lenslets 12 with typically have clear aperture diameters of about 1–2 millimeters. However, the fewer the number of lenslets on the array, the larger are the clear apertures of these lenslets. Thus, the clear aperture diameters of individual lenslets may exceed 2 mm. If the field of view of the lenslet array system is very large, these lenslet arrays tend to contain a large number of lenslets. The larger the number of lenslets in the array, the shorter can be the lenslet array's focal length. Thus, an array with a large number of lenslets can fit into a smaller, more compact package.

The lenslets 12 are arranged on a common substrate 13. It is preferred that this substrate be about 0.5 to 2.5 mm thick. It may be thicker, but additional thickness is undesirable because it makes the overall lenslet array system less compact. If this substrate is made too thin it may become fragile. Thus, it is most preferred that the substrate thickness be 1–2 mm. The specific parameters for the exemplary lenslets are provided in the "Lens component description" of the specification.

1. First embodiment.

Figure 4A:
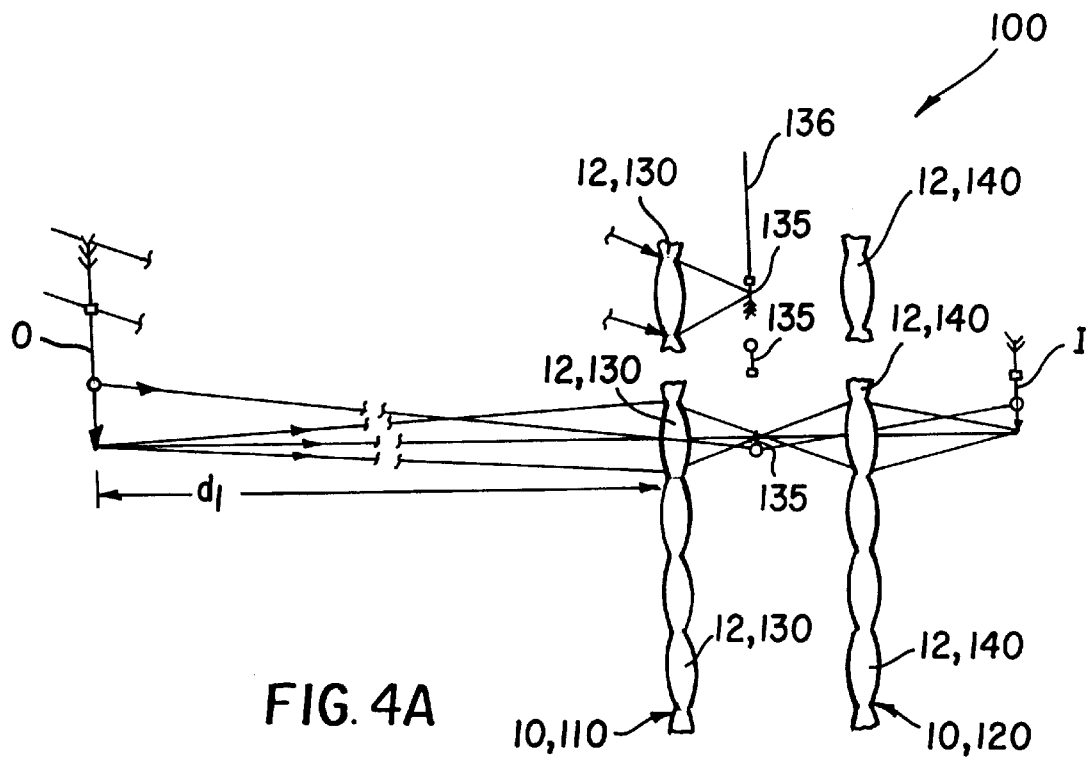
FIG. 4A shows schematically a sectional view of a lenslet array system 100 of a first preferred embodiment of the present invention.
Figure 4B:
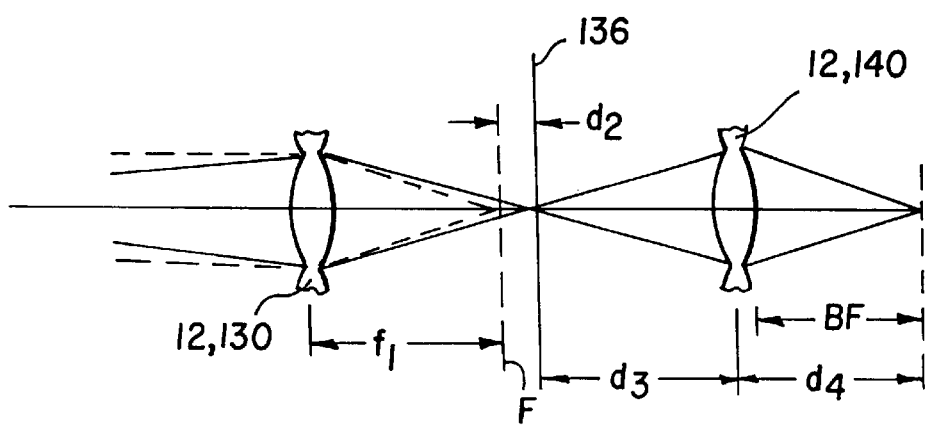
FIG. 4B illustrates the positioning of lenslets 130 and 140 of the lenslet array system 100 relative to one another and relative to the intermediate image plane.

According to the first embodiment, the lenslet array system 100 comprises a plurality of lenslet arrays 10 which include a first lenslet array 110 and a second lenslet array 120 which as shown in FIG. 4. The lenslet array 110 functions as an imaging lens and the lenslet array 120 functions as a relay lens. Each lenslet array 110, 120 comprises a plurality of lenslets 12. It is contemplated that the lenslet arrays 110 and 120 may contain thousands of lenslets 12.

In this embodiment, lenslets 12 of the first lenslet array 110 are called lenslets 130. Each lenslet 130 has positive optical power. It has a focal length $f_1$ of 3.0 mm and an F-number F/2. Each lenslet 130 functions as a separate imaging lens. Each lenslet 130 is shaped to accept a unique segment of the field of view and to create an inverted image section corresponding to this segment of the field of view. That is, each lenslet 130 creates a small, discrete, inverted section 135 of the overall image. The multiple image sections are not continuous and are not oriented properly with one another to permit either a direct viewing or film photography (see FIG. 4A). The second lenslet array 120 is needed to reimage the multiple image sections 135 (located at the intermediate image plane 136) created by the first lenslet array 110 to form a single, continuous, correctly oriented image I out of these multiple images sections 135. More specifically, lenslets 12 of the second lenslet array 120 are called lenslets 140. These lenslets 140 have positive optical power, a focal length $f_2$ of 0.5 mm and the F-number F/2. Each lenslet 140 corresponds to one of the plurality of lenslets 130 on the first lenslet array 110. Each lenslet 140 functions as a relay lens. That is, each lenslet 140 of the second lenslet array 120 reimages and reinverts an image section 135 created by its corresponding lenslet 130 of the first lenslet array 110. The image I may be formed on any photosensitive surface including photographic film, paper or a CCD array.

It may be preferred in some digital camera application that the image I created on the photosensitive pixels of the sensing array not be continuous, because these pixels are not located substantially adjacent to one another. In this case the lenslets 140 reimage the plurality of "scrambled" image sections 135 into a plurality of the unscrambled final image sections that form an overall, correctly oriented, discontinuous image I of the object O.

The focal lengths $f_1$ of lenslets 130 are relatively small, preferably smaller than about 15 millimeters and more preferably smaller than 12 millimeters and even more preferably smaller than about 10 millimeters. Most preferably it will be in the 2 to 7 mm range. As stated above, in this embodiment it is 3 mm. It may be as small as 1 mm or 0.5 mm. The smaller is the focal length $f_1$, the more compact is the total length of the lenslet array system. However, the smaller is the focal length $f_1$ (given specified field of view for each of the lenslet 120), the smaller is the size of an intermediate image section 135. Thus, if $f_1$ is in the range of 1 mm to 0.5 mm (or smaller) the size of the image sections 135 may become to small for their proper reimaging on film. If film is used as the photosensitive medium, the film grain size will be one of the major factors determining the smallest possible size for the image sections 135. Alternatively, in digital camera applications, the size of the focal length $f_1$ may be limited by the size of the photosensitive pixels. Therefore it is preferred that $f_1$ be larger than 0.5 mm and preferably larger than 1.0 mm.

FIG. 4A illustrates that the first lenslet array 110 forms image sections 135 (on an intermediate image plane 136) of an object O which is located at an object distance $d_1$ from the front vertex of the central lenslet 130. It is preferred that the object distance $d_1$ be equal to more than 20 times the focal length $f_1$ of the lenslet 130 (i.e., $d_1$ is larger than 20 times $f_1$, where $f_1$ is smaller than 15 mm). Than, any object which is located at a typical viewing distance for the camera type applications (i.e. 300 mm or more in front of the camera) will be located at object distances which are effectively at infinity for the first lenslet array 110. The intermediate image plane 136 serves as an object plane for the lenslet array 120 and should be located a distance $d_2$ behind the focal plane F of the first array, the distance d being <5% of $f_1$. Therefore, this lenslet array system embodiment is insensitive to the changes in the object position. This is schematically illustrated in FIG. 4A, where the distance $d_2$ is shown greatly exaggerated.

It is preferred that in order to provide a reasonable back focus distance, the ratio $f_1$ to $f_2$ be between 1 and 10, where $f_1$ is the focal length of the front lenslet array 110 and $f_2$ is the focal length of the rear, lenslet array 120. It is even more preferred that this ratio be between 1 and 7 and most preferred to be between 1 and 5. The shorter is the $f_2$ the more compact is the overall lenslet array system. If the ratio of the two focal lengths $f_1/f_2$ becomes smaller than 1, the back focus distance tend to become too large, and the lenslet array system tends to become less compact. If the ratio of the two focal lengths $f_1/f_2$ becomes larger than 20, the field of view of the relay lenslets 140 becomes large, the lenslet array system aberrations become difficult to correct and the image quality suffers. As stated above, in this embodiment $f_1$ is 3.0 mm and $f_2$ is 0.5 mm. The value of the ratio $f_1/f_2$ is 6.0. The spacing between the second array (relay array) and the intermediate image plane 136 should also be about or greater than $1.2 \times f_2$ in order to have a reasonable total length. If it is desirable to reimage the image sections 135 on the final image plane at 1:1 magnification the lenslets 140 should be spaced out form the intermediate image plane by a distance $d_3$ which equals $2 \times f_2$. (See FIG. 4A). Then, the final image plane would be located a distance $d_4$ (where $d_4$ equals to 2 times $f_2$, and $f_2$ is the focal length of lenslets 140) away behind the second lenslet arrays. The lenslet array system's back focus may be larger than $2 \times f_2$ if more than 1:1 magnification is desired from the lenslets 140. Lenslet array system 100 has a back focus distance of about 1.7 mm. The overall length T of the lenslet array system 100 is about 5.2 mm.

Baffling system associated with the lenslet array system 100.

Figure 5:
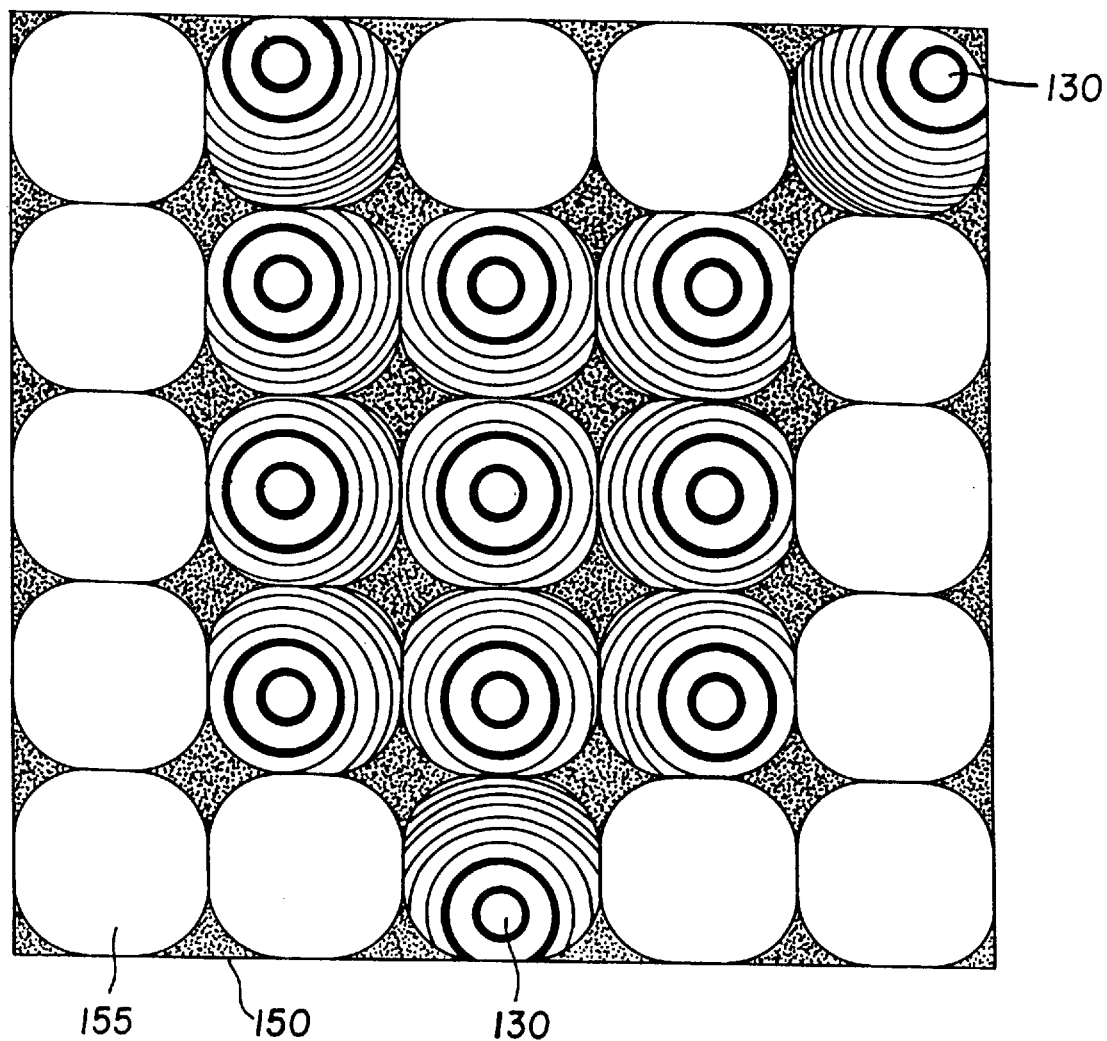
FIG. 5 shows a top view of the baffle plate 150 and the lenslets 130 of the first lenslet array 110.
Figure 6:
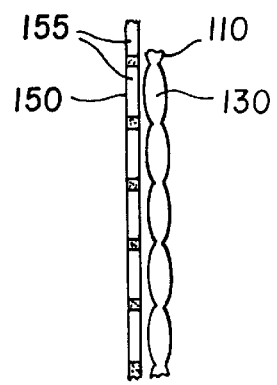
FIG. 6 illustrates a side view of the baffle plate 150 and the lenslet array 110.

An opaque baffle plate 150 having multiple openings 155 is positioned in front of the lenslet array 110. (FIG. 5 and 6). It may serve as an aperture stop array. The openings 155 of the plate 150 are aligned with the individual lenslets 130 to allow the proper light beams to go through the lenslet array system. The size and the shape of the lenslets 130 match the size and the shapes of the openings 155. The opaque portion of the plate 150 prevents the light rays from passing between the lens elements, from propagating further into the lenslet array system as unwanted (also referred to as stray) light, and from reducing image quality. The function of the baffle plate 150 may also be incorporated into the structure of the lenslet array 110 by making the substrate of the lenslet array 110 opaque to light in all areas not occupied by the lenslets 130.

Figure 7:
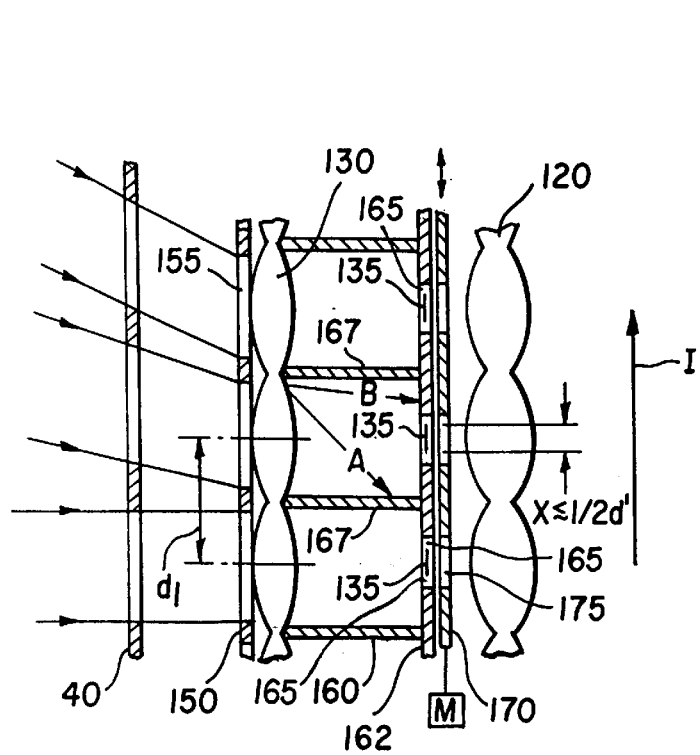
FIG. 7 illustrates the baffle structure 160.
Figure 8A:
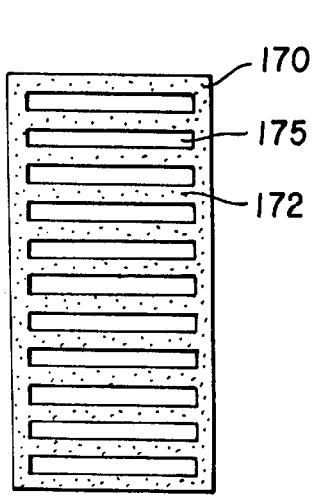
FIGS. 8A–C illustrates three possible configurations of a shutter plate 170.
Figure 8B:
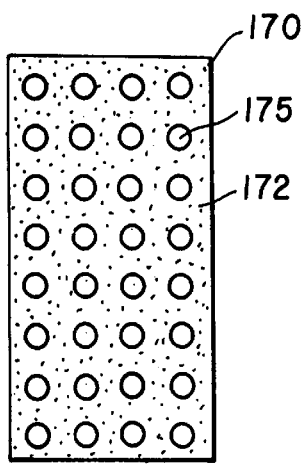
Figure 8C:
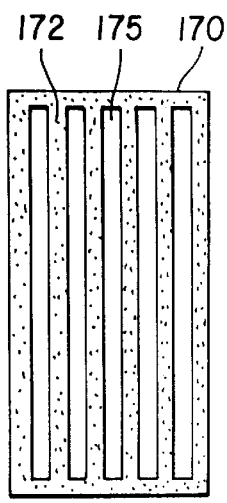

The field of view of the first lenslet array 110 is limited by an opaque baffle structure 160. (FIG. 7) The baffle structure 160 includes a field limiting opaque plate 162 with a plurality of apertures 165, and a plurality of baffle walls 167. These baffle walls 167 absorb stray light rays (A) exiting lenslet 130 and thus prevent it from ether propagating towards another (inappropriate) image segment 135 or from reflecting off the walls and propagating towards the image segment associated with the specific lens element 130. The baffle walls 167 may also serve as spacers between the lenslet array 110 and the intermediate image plane. The opaque plate 162 with a plurality of apertures 165 functions as a field stop. More specifically, the opaque plate 162 is located at or near the intermediate image plane 136. Each aperture 165 frames a small image section 135 created by one of the lenslets 130 and in combination with the opaque section of the plate 162 surrounding this aperture serves as a field stop for this lenslet. The opaque section of the plate 162 also blocks unwanted field rays B and prevents these rays from propagating towards the relay lenslet array 120. A shutter 170 is located in a vicinity of the plate 162. It is composed of a series of holes 175 in an opaque shutter plate 172. The examples of shutter 170 are schematically illustrated in FIG. 8A–8C. The shutter 170 may be located in front or behind the intermediate image plane. The holes 175 of the shutter 170 are aligned with the opaque areas of the field limiting plate 162, but can be displaced, for example by a spring operated mechanism M, to align with the holes 165 (FIG. 7) in order to expose the photosensitive medium for the desired amount of time. In order for this type of shutter mechanism to work, the intermediate image sections located at or near the focal plane of the imaging lenslets 130 must be equal or smaller than ½ the spacings d' between (the centers of) lenslets 130. It is noted that a different shutter arrangement may also be utilized. For example, conventional shutters such as a focal plane shutter, or an iris shutter located in font of the lenslet array system may be used to prevent the photosensitive area from being exposed. If a conventional shutter is used, the spacing between the image sections 135 may be smaller or larger than ½ spacing between the centers of the lenslets.

2. Second embodiment.

Figure 9A:
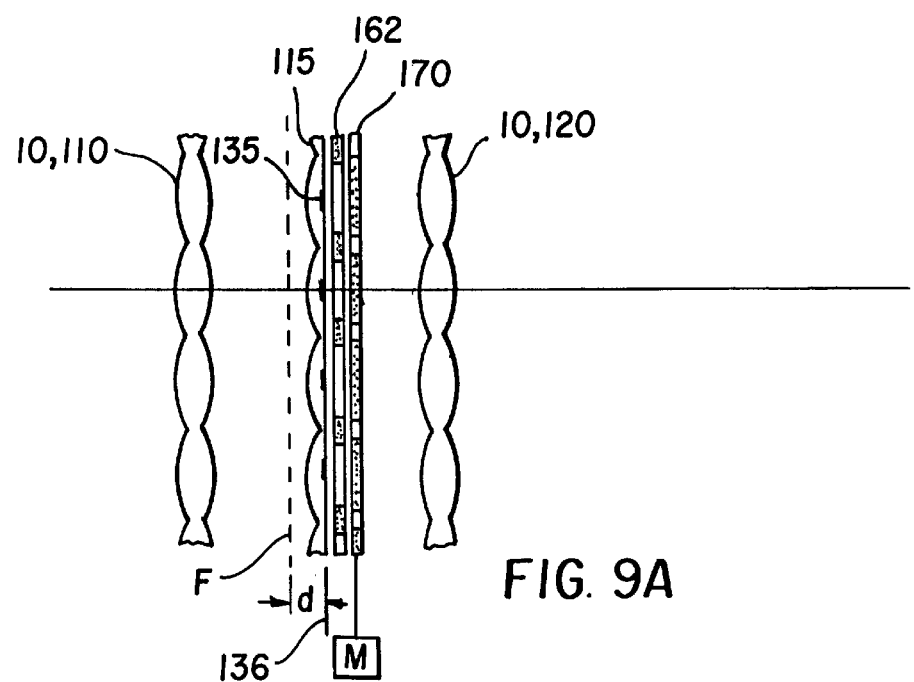
FIGS. 9A and 9B illustrate the second embodiment of the lenslet array system of the present invention.
Figure 9B:
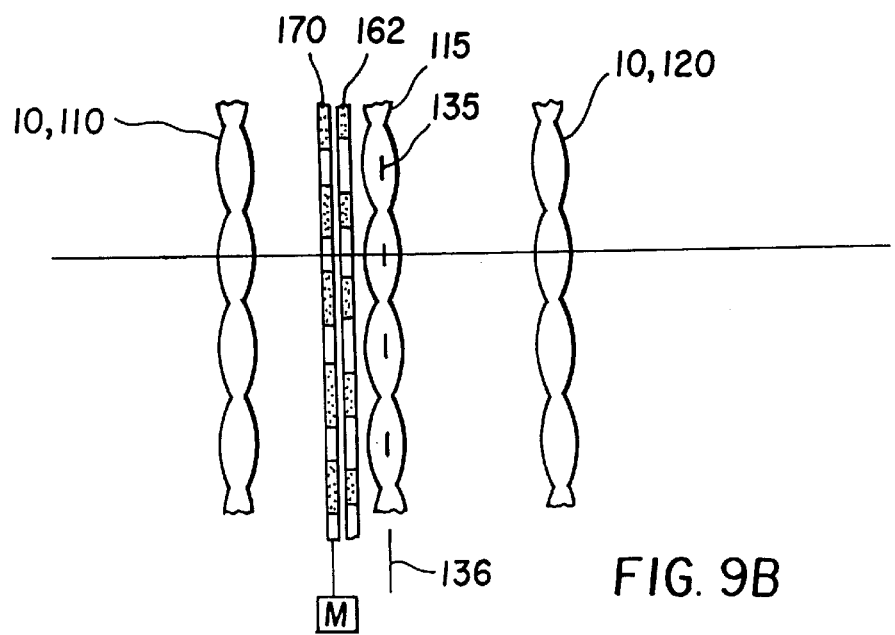

Lenslet array system 200 of the second embodiment of the present invention is schematically illustrated in FIGS. 9A and 9B. Lenslet array system 200 comprises three lenslets arrays 110, 115, and 120. Lenslet arrays 110 and 120 of the second embodiment serve the same function as lenslet arrays of 110 an 120 of the first embodiment. The lenslet array 110 is the imaging lenslet array and the lenslet array 120 is the relay array. Lenslet array 120 comprises a plurality of lenslets 140. The Lenslet array 115 serves the function of the field lens. It is located at or near the intermediate image plane and bends the field rays towards the optical axis of the individual lenslet, making the lens bundles incident on each of the lenslets 140 smaller. The field lenslet array 115 is especially useful in a lenslet array system with a large field of view because it sends more light rays towards the lenslet array 120 and thus allows for the smaller size lenslets 140 in the lenslet array 120. In this system, the field plate 162 and the shutter 170 may be located either in front or behind the field lens array 115. FIG. 9A shows the field lens array 115 located in front of the field plate and the shutter, while FIG. 9B shows the field lens array 115 located in behind of the field plate and the shutter. As stated above, the holes 175 of the shutter 170 are aligned with the opaque areas of the field limiting plate 162, but can be displaced, for example by a spring operated mechanism M, to align with the holes 165 in order to expose the photosensitive medium for the desired amount of time. In FIG. 9A the shutter is in the closed position, while in FIG. 9B the shutter is shown in the open position. As in the previous embodiment the intermediate image plane 136 serves as an object plane for the lenslet array 120 and should be located a distance $d_2$ behind the focal plane F of the first array, the distance $d_2$ being less than 5% of $f_1$. Therefore, this lenslet array system embodiment is insensitive to the changes in the object position.

3. Third embodiment.

Figure 10:
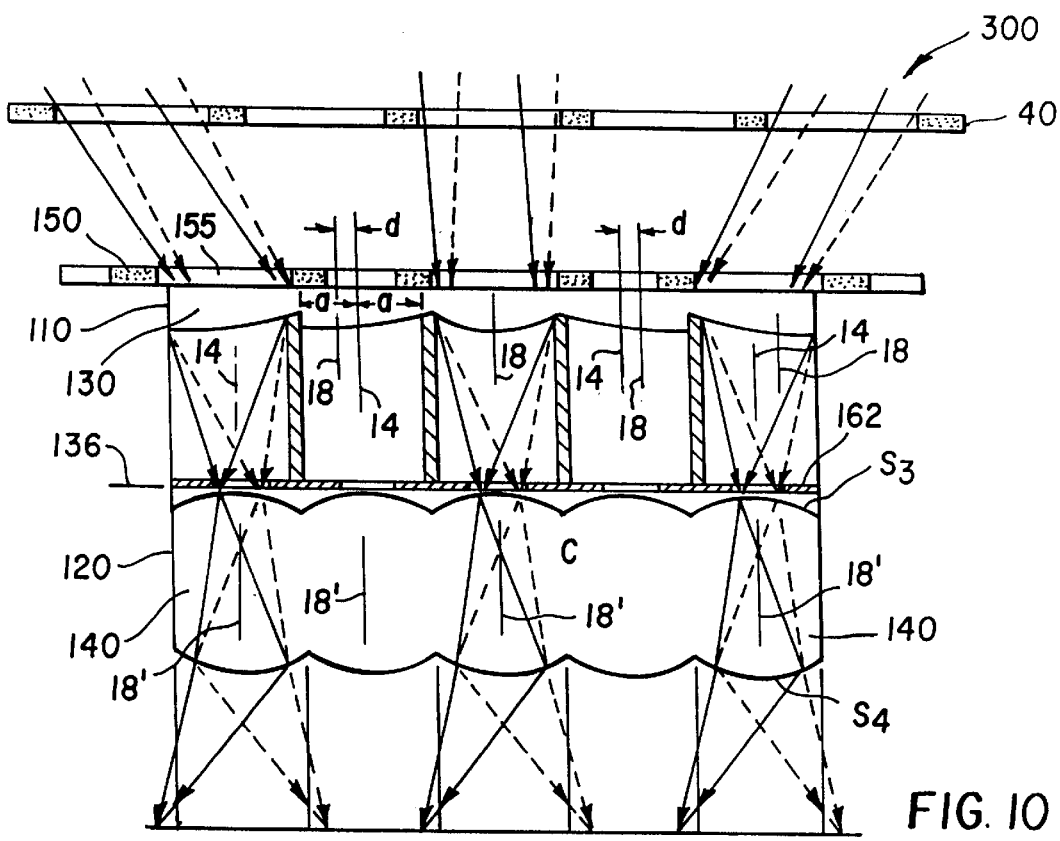
FIG. 10 illustrates yet another embodiment of the lenslet array system of the present invention.
Figure 11:
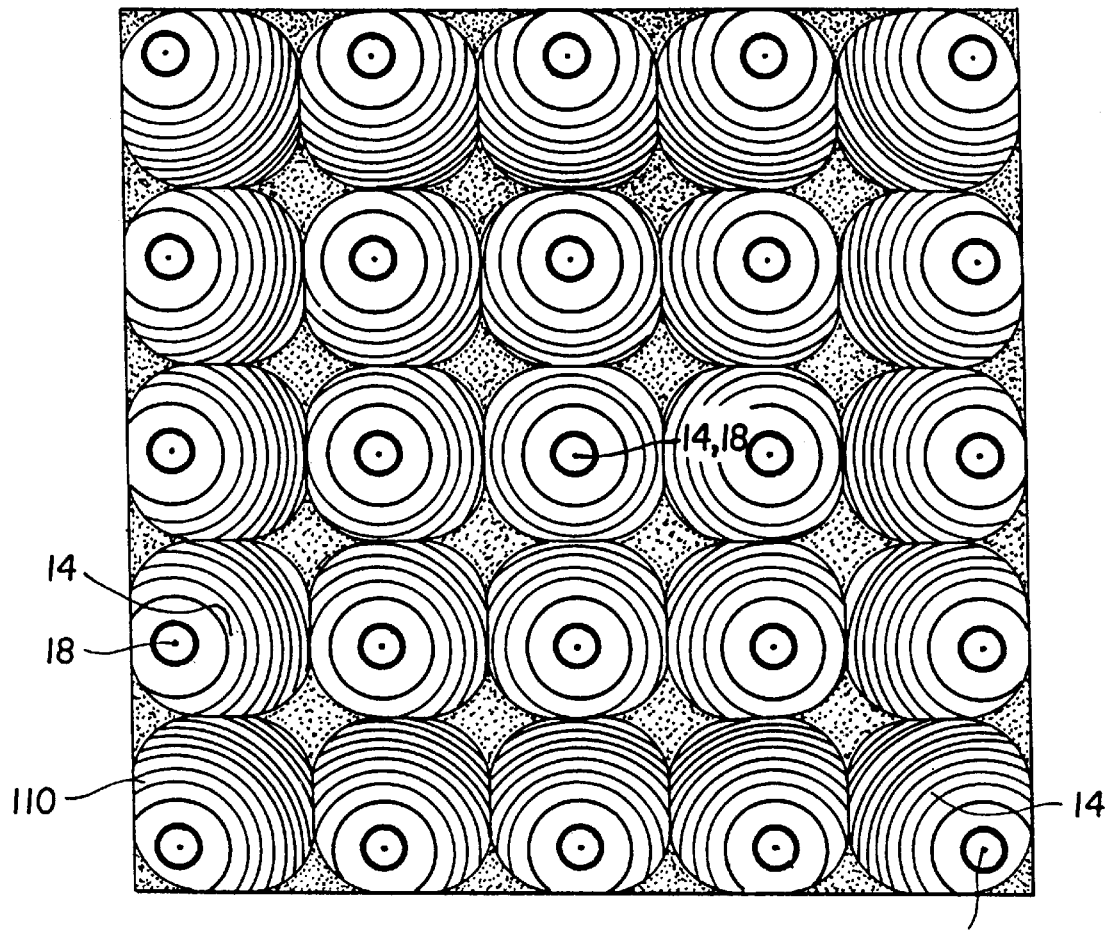
FIG. 11 illustrates the top view of the embodiment shown in FIG. 10.

Lenslet array system 300 of the third embodiment of the present invention is schematically illustrated in FIG. 10. Lenslet array system 300 comprises two lenslets arrays 110, and 120. Lenslet arrays 110 and 120 of the lenslet array system 300 serve the same function as lenslet arrays of 110 an 120 of the first embodiment. More specifically, the lenslet array 110 is the imaging lenslet array. It is made of a plurality of lenslets 130. In the lenslet array system 300 all of the lenslets 130, with an exception of a center lenslet are decentered lenslets. That is, their individual optical axis 18 and their unit cell axis of symmetry 14 do not overlap. This is illustrated in FIG. 11. The unit cell axis of symmetry is defined as an axis of symmetry of the space occupied by an individual lenslet. The parameters for an exemplary lenslet 110 are described in detail in the "Lens component description" of the specification. This arrangement of lenslets on the lenslet array 110 allows each of the individual image segments 135 to be centered on the unit cell axis 14 of corresponding lenslet 130. This allows the corresponding lenslet 140 of the second lenslet array 120 to be located right behind its corresponding lenslet 130. The optical axis 18' of the second lenslet array 120 may then be colinear with the unit cell axis 14 of the first lenslet array 110. This allows for a very compact lenslet array system.

As stated above, the lenslet array 120 is the relay (or reimager) lenslet array. The lenslet array 120 reimages the multiple, inverted image segments 135 located at the intermediate image plane into a continuous, correctly oriented image located at the final image plane. In addition, the lenslet array 120 serves the function of the field lens. That is, lenslet array 120 of this embodiment is a field lens array. More specifically, the front (object facing) surface $S_3$ of lenslet 140 is located at or in the vicinity of the intermediate image plane 136 and bends the field rays C towards the optical axis 18' of this lenslet. It is preferred for the surface $S_3$ to be spaced slightly away from the intermediate image plane so that the dust particles or scratches present on the surface $S_3$ would not be reimaged onto the final image plane. The rear surface $S_4$ (i.e., the surface facing the final image plane) of the lenslet 140 provides the re-imaging function. The final size of the image is about the same as the size of the lenslet array 120. The baffling system employed in lenslet array system 300 is similar to the one employed by the lenslet array system 100 and 200 and is also shown schematically in FIG. 10. It includes an opaque baffle layer 150 with multiple transmissive sections or apertures 155, and a baffling structure 160 which is similar to the baffling structure 160 of the lenslet array system 100. A shutter, similar to the shutter 170, is located behind the baffling plate 162. In order for the shutter to work, the size of the image sections 135 located at the intermediate image plane 136 must be smaller than ½ spacing d' between lenslet unit cell centers. However, if a different shutter arrangement is utilized, the size of the image sections 135 may be larger.

4. Fourth embodiment

Figure 12:
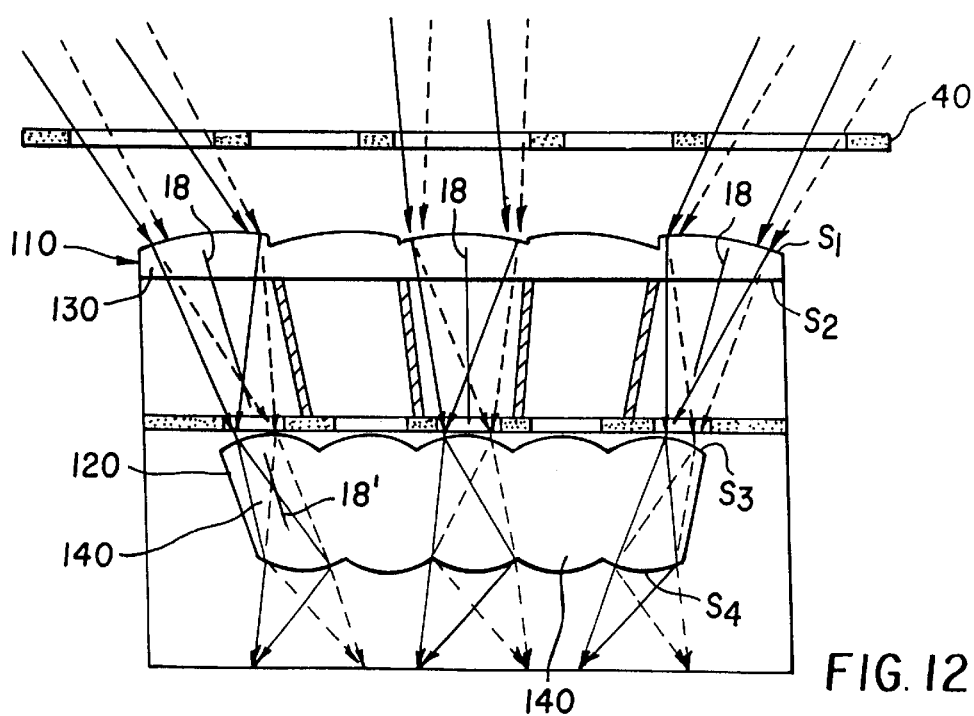
FIG. 12 illustrates yet another embodiment of the lenslet array system of the present invention.

Lenslet array system 400 of the third embodiment of the present invention is schematically illustrated in FIG. 12. Lenslet array system 400 comprises two lenslets arrays 110, and 120. Lenslet arrays 110 and 120 serve the same function as lenslet arrays of 110 an 120 of the third embodiment. More specifically, the lenslet array 110 is the imaging lenslet array. It is made of a plurality of lenslets 130. All of the lenslets 130, with an exception of a center lenslet are "tilted" lenslets. That is, the central ray in their field of view is not perpendicular to the intermediate image plane 136. This arrangement is described in detail in the "Lens component description" of the specification. The lenslet array 120 is the relay (or reimager) lenslet array and comprises a plurality of lenslets 140. In addition, the lenslet array 120 is also designed to serve as a field lens array. Thus, the front surfaces of lenslets 140 are convex. The front (object facing) surface of the lenslet array 120 is located at or in the vicinity of the intermediate image plane and bends the field rays towards the optical axis 18' of the lenslet 140 of the second lenslet array 120. The rear lenslet surface $S_4$ (i.e., the surface facing the final image plane) of the lenslet array 120 serves the re-imaging function. The lenslet array 120 reimages the multiple, inverted image segments 135 located at the intermediate image plane into a correctly oriented image located at the final image plane. This image is continuous if the lenslet array system images on film. It may be continuous or discontinuous if a CCD or a similar array is used as a photosensitive surface.

As can be seen, the centers of lenslets 130 are displaced relative to the centers of the corresponding lenslets 140. The lenslet array system 400 is not as compact as lenslet array system 300. This is because in order to achieve the same final image size, as achieved by the lenslet array system 300, the lenslet array 110 of the lenslet array system 400 needs to be larger than the lenslet array 120.

II. Lens component description

1. Imaging lenslet array.

EXAMPLE 1

Figure 13:
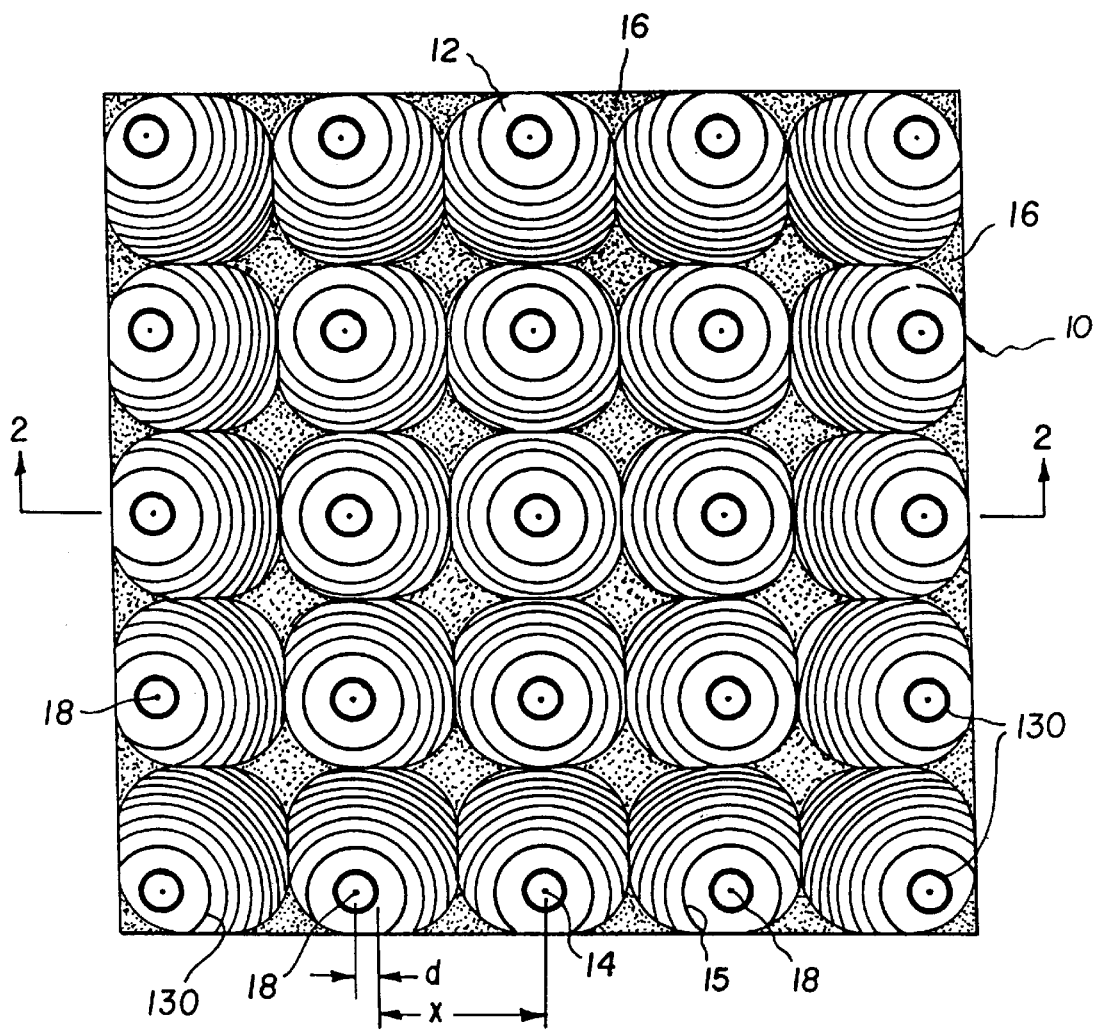
FIG. 13 is a top view of lens contours and baffles for the lens array 10 of the present invention.

Referring to FIG. 13, a lenslet array 10 is formed with an array of achromatized refractive/diffractive lenslets 12 or refractive lenslets. Such an array may be used as first array 110 in the first, the second or the third lenslet array system embodiment, respectively. These embodiments are described in the "lenslet array system description" section of this application. To be observed in this figure is that the center of the optical axis 18 of each lenslet 12 is displaced by a distance d relative to the fixed unit cell to unit cell distance X as a function of its radial distance from the optical axis of the central lenslet. The lines 15 appearing around the optical axis 18 of each lenslet 12 are topographical lines indicating changes in height of the lenslet's surface. An opaque mask 16 fills the areas between the lenslets 12 to prevent stray light from propagating farther into the optical system. The array depicted in FIG. 13 represents only a small portion of an array that will be used in an actual camera. In an actual implementation many more lenslets are used to form the array. Other configurations of the lenslets 12 may be used such as forming the outer periphery of each lenslet as a square, hexagon, or circle, without detracting from the invention.

In order for the lenslet array 10 to see different fields of view the optical axis 18 of the lenslets 12 in the lenslet array are located at a distance which becomes progressively larger than the center-to-center distance of the unit sells of the lenslet array. As stated above, the displacement d of the lenslets optical axis 18 increases radially from the center of the array. Decentering a lenslet tends to bend rays from the off-axis field angles to be incident perpendicular to the intermediate image plane. By moving the optical axis 18 of the lenslet further out radially with increasing distance from the center of the array, the angular location of object at the center of the field of view for a given lenslet originates from increasingly off-axis segments of the total field of view (see FIG. 14).

For instance, the required decenter for a lenslet 12 of focal length $FL_i$ necessary to deflect the ray from the desired field angle into the center of the array element's field stop can be determined from the paraxial ray tracing equations. The paraxial equations are $$y' = y_o + nu(t/n)$$

$$n'u' = n_o u_o - y\phi$$

where y'=height after propagation to next surface $y_o$=height at previous surface u=paraxial slope angle (radians)

$u_o$=slope angle before refraction

φ=power of array element (φ=1/$FL_i$)

n=refractive index of the medium

Therefore, the displacement d for a given lenslet with power φ=(1/$FL_i$) that is necessary to bend the central ray from a given angle of incidence $u_o$ to a desired angle u', after refraction is given by $$d=y=(n_o u_o - n'u')/FL_i$$

The invention utilizes an array of lenslets where the local displacement of the lenslets optical axis varies as a function of radial position relative to the center of the lenslet array system's optical axis, so that, to first order $$d(r)=(n_o u_o(r) - n'u'(r))/FL_i$$

Figure 14:
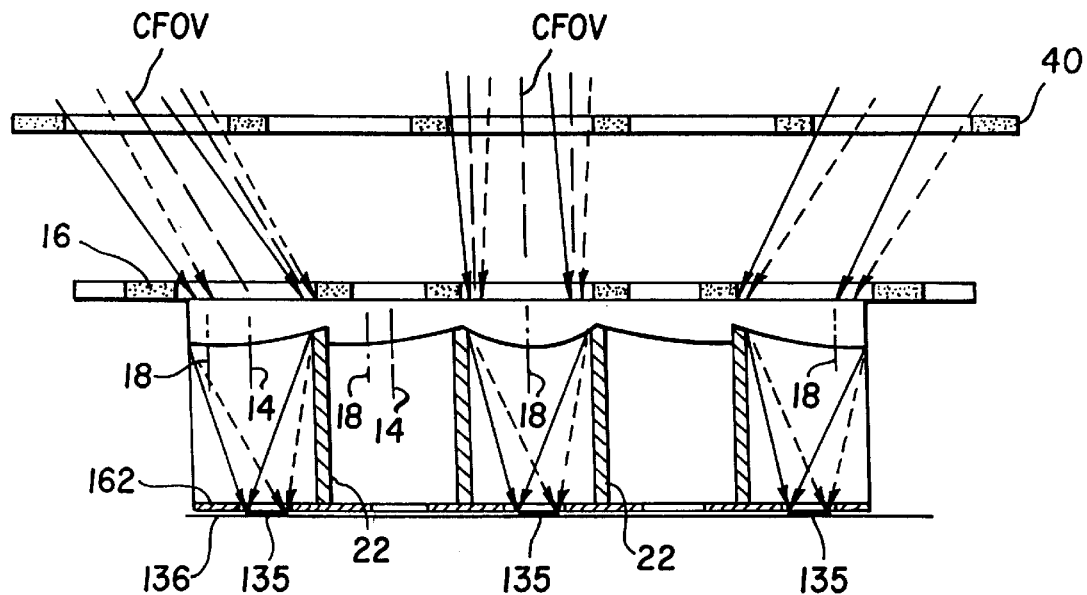
FIG. 14 is a sectioned view taken along the section lines 2—2 of the lens array of FIG. 13.

The invention consists of adjusting the lenslet decenters so that u'(r)=0 for the central ray within a given lenslet's field of view (see FIG. 14). In this case the decenter d necessary for a given element is approximately a linear function of the element's radial distance from the system's optical axis.

Referring now to FIG. 14, the lenslet array 10 is positioned over an intermediate image plane and creates a plurality of image segments 135. A shutter may be located next to the intermediate image plane 136. The lens array 10 is maintained a distance apart from the shutter by spacers 22 that may also serve the function of being baffles. As can be seen from FIG. 14, the opaque baffles 16 on the lenslet array 10 may be combined with a field stop (aperture plate 40) to limit the field of view of any particular photosensor so that it does not overlap the field of view of it neighbors by a large amount. The aperture plate 40 is preferably positioned approximately 0.5 mm to 2 mm from the surface of the lenslet array 10. To further define a field of view seen by each individual lenslet 12 the aperture plate 40 may be a layer of clear glass having a dyed photoresist mask pattern formed on one of its surfaces. The center of the apertures in the aperture plate 40 are aligned to the center of the field of view (CFDV) of a corresponding lenslet. The spacing of the centers of apertures in the plate 40 increases as a function of each lenslet's radial position radially from the center of the array causing the aperture plate to be slightly larger than the associated lens array. The combination of the opaque areas 16 with the aperture plate 40 and/or the field limiting plate 162, and a given lenslet focal length determines the field of view for a particular lenslet on the lenslet array. The lenslet array 10 can be formed by etching a photosensitive pattern into quartz, or formed as an epoxy replica on a quartz substrate or as a photoresist surface relief part on a glass substrate, or be injection molded as a plastic part.

The lenslets 12, combined with the appropriate field stop (such as the aperture plate 40), and/or the field limiting opaque plate 162, form images of a small segment of the field of view on an intermediate image plane 136. By forming the lenslets 12 with decentrations d of the optical axis 18 which increase radially across the lenslet array, the angle which the ray beam incident on any of the lenslet 12 will increase as a function of radial position of this lenslet on the array. Therefore, by appropriately adjusting the decenters of each lenslet each image section corresponds to a unique or different segment of the scene.

Lenslet array 10 may an array of aspheric lenslets to improve the lenslet array system performance. However, even aspheric lenslets do not correct for the variation in focal length as a function of wavelength if these lenslets are formed from a single refractive material. That is, the spot sizes at the image plane will vary as a function of color. In order to correct the chromatic aberration, an improved lenslet array system including an array of diffractive/refractive hybrid lenslets may be used instead of an array of purely refractive lenslets. The imaging properties of diffractive optics are strongly wavelength dependent. When modeling a diffractive optic this phenomena can be represented as a direct dependence of equivalent refractive index n(λ) on wavelength(λ):

$$n(\lambda)=[\lambda_c/\lambda](n_c - 1) - 1$$

Diffractive elements impart all of their wavefront bending in an extremely thin layer. This is accounted for in the Sweat model by modeling the diffractive as a very high index material ($n_c$=10,000) with very low curvatures (weak surfaces) on each surface. The corresponding focal length f(λ) can then be determined from:

$$f(\lambda)=[n(\lambda)-1]\Delta c$$

so that $$f(\lambda)=(\lambda_c/\lambda)f_c$$

where $\lambda_c$=design center wavelength

The resultant dispersion $v_{diff}$ of the diffractive element is:

$$v_{diff} = \frac{n(\lambda_c) - 1}{n(\lambda_s) - n(\lambda_L)}$$

which reduces to:

$$v_{diff} = \frac{\lambda_c}{\lambda_s - \lambda_L}$$

For designs using: $\lambda_c$ 587 nm, $\lambda_s$=486 nm, and $\lambda_L$=656 nm the value for $v_{diff}$ is −3.5.

For other wavelength bands of interest an appropriate $v_{diff}$, and element power distribution can be calculated. The direct dependence of the equivalent refractive index on wavelength leads to a small, negative, $v_{diff}$ and a high level of wavelength dispersion associated with a first order (m=1) diffractive optical element.

Due to the variation of refractive index with wavelength, a single element lens has a variation of focal length with wavelength. Two materials with different dispersions can be used to form a doublet lens which has the same focal length at two wavelengths and reduced variation over the whole spectrum. The relative distribution of focal powers required to achieve this is given by $$\phi_{ref} = \frac{v_{ref} * \phi_{total}}{v_{ref} - v_{diff}}$$

$$\phi_{diff} = \frac{v_{diff} * \phi_{total}}{v_{diff} - v_{ref}}$$

The negative $v_{diff}$ of the diffractive surface allows for achromatization of single element hybrid refractive/diffractive lenses utilizing a positive focal length diffractive and refractive component. It also decreases the focal length and F/# required of the doublet component lenses because a refractive doublet consists of a positive crown (low dispersion) lens with a shorter focal length and smaller F/# than is required for a singlet and a negative flint element which increases the doublet focal length to the correct value and compensates for the dispersion of the positive lens. This effect also decreases the size and weight of the positive element of a hybrid refractive/diffractive element.

For traditional achromatization in the visible regime (d-e-f lines) with PMMA (polymethylmethacrylate) plastic lenses the fraction of power in the refractive and diffractive portions would be $\Phi_{ref}/\Phi_{total}=94.25$ $\Phi_{diff}/\Phi_{total}=5.75\%$ It is obvious to a person skilled in the art that one can utilize substrates such a quartz, or optical glasses such as BK7, or utilize epoxy replicas on glass substrates.

The use of diffractive/refractive hybrid achromatization enables the use of diffractive surfaces with longer focal lengths and higher F-numbers. The high F-number makes the diffractive element easier to manufacture due to the large zone spacings. For instance, for a lenslet with a F/#=3.0 mm and a F/#=2.0 the first order analysis of the refractive and diffractive portions would provide focal lengths (f) and F numbers (F#) of $f_{ref}$ = 3.186mm $F/\#$ = 2.12
$f_{diff}$ = 52.176mm $F/\#$ = 34.8

This assumes that the diffractive portion of the lenslet was used purely for first order chromatic correction.

Figure 15A:
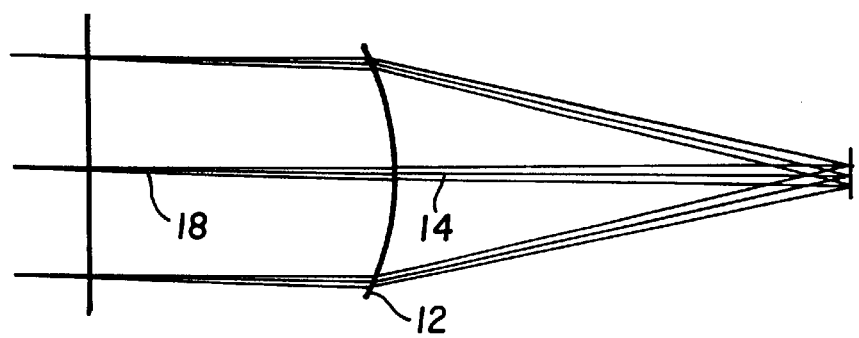
FIG. 15A illustrates in cross section a central lenslet 12 of the first lenslet array 10, 110.
Figure 16A:
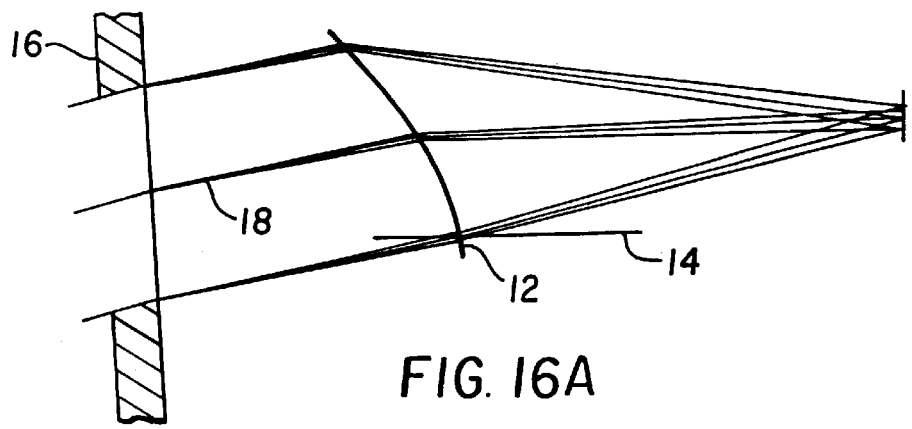
FIG. 16A illustrate in cross section a lenslet of the first lenslet array 10, 110 at a 16 degree field angle.
Figure 17A:
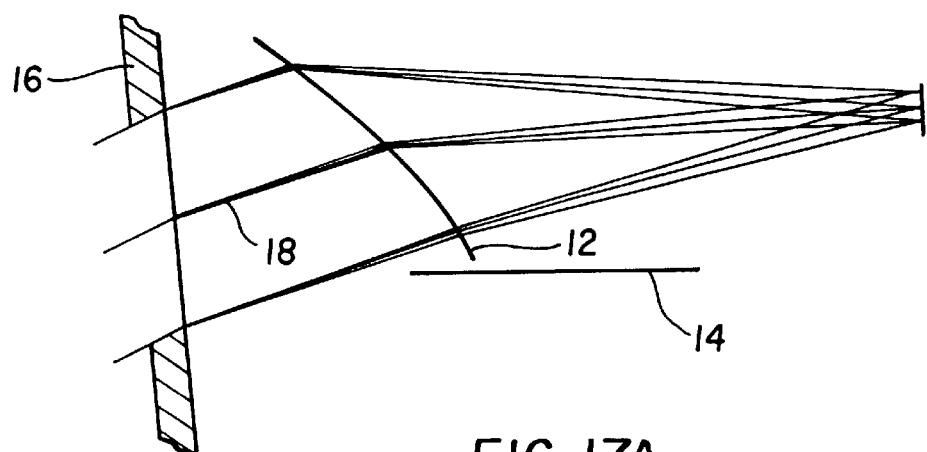
FIG. 17A, illustrate in cross section a lenslet of the first lenslet array 10, 110 at a 24 degree field angle.
Figure 15B:
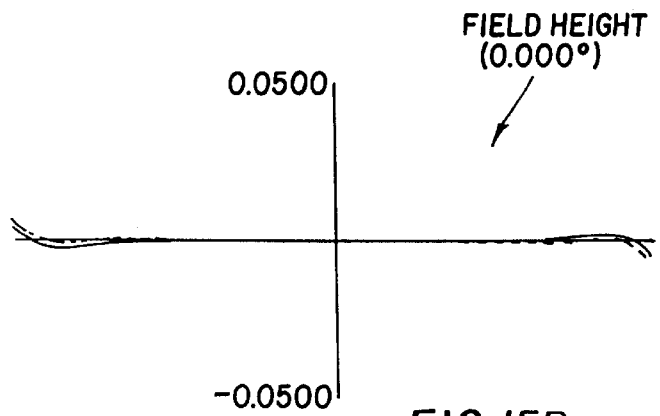
FIGS. 15B and 15C represent the tangential and saggital ray aberration curves for the lenslet illustrated in FIG. 15A.
Figure 15C:
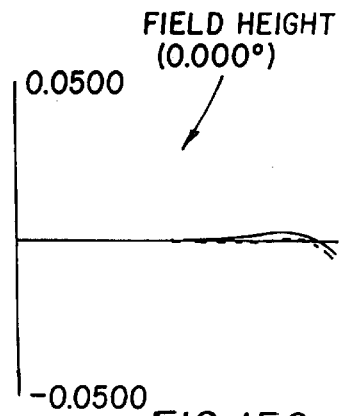
Figure 16B:
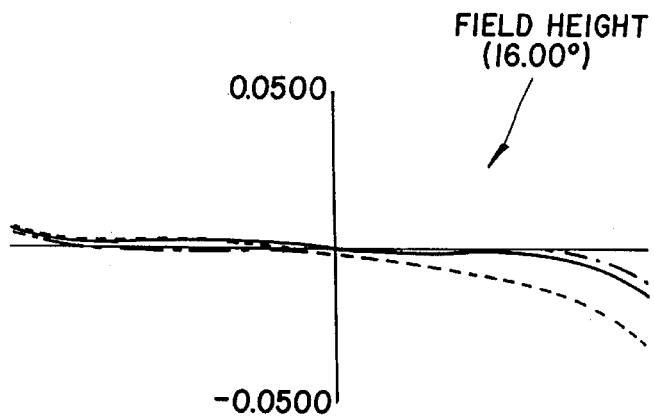
FIGS. 16B and 16C represent the tangential and saggital ray aberration curves for the lenslet illustrated in FIG. 16A.
Figure 16C:
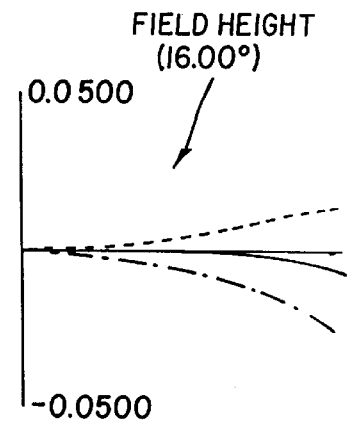
Figure 17B:
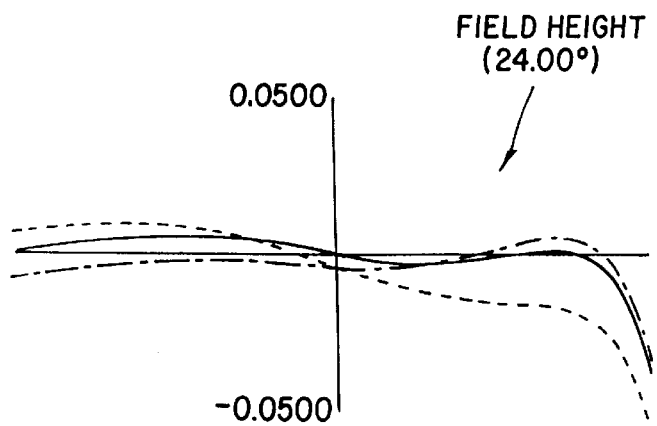
FIGS. 17B and 17C represent the tangential and saggital ray aberration curves for the lenslet illustrated in FIG. 17A.
Figure 17C:
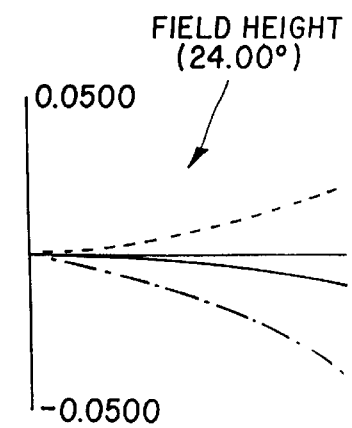

The diffractive lenslets 12 are shown in FIGS. 15A, 16A, and 17A, for the on-axis, 16 degrees, and full field of view. To be noted in a comparison of these figures is that the optical axis 18 is moving radially outwards as a function of field angle. It is noted that the opaque baffle 16 acts as the aperture stop for the system and limits the field of view of a given lenslet 12.

FIGS. 15B, 15C, 16B, 16C, and 17B, 17C represent the tangential an saggital ray aberration curves for their respective lenslets. It is noteworthy that the overall spot size including chromatic aberration is approximately 30 microns. The solid lines represent a wavelength of 546.1 nm, the dotted lines represent a wavelength of 656.1 nm, and the dotted and dashed lines represent a wavelength of 460.0 nm which represent light in the green, red, and blue, wavelengths.

The following table lists the optical design parameters for three array elements at 0, 16, and 24 degrees. The array elements at the intermediate field angles can be interpolated from these values.

EXAMPLE 1. A

0 Degree Lenslets
EFL=3.0 mm
F/#=2.0

TABLE 1

| Surface No. | Radius | Thickness | Glass |
|---|---|---|---|
| Object | | Infinity | Air |
| 1 Aperture Stop | | 2.0 | BK7 |
| 2 | −1.639 | 3.0 | Air |
| Aspheric Coeff. | k = 0.973 | Diffractive | DF3 = −8.2 × 10⁻³ |
| | AD = 1.04 × 10⁻¹ | Coeff. | DF5 = −8.4 × 10⁻³ |
| | AE = −3.35 × 10⁻² | | DF10 = −8.3 × 10⁻⁵ |
| | AF = 1.17 × 10⁻¹ | | DF14 = 1.4 × 10⁻³ |

TABLE 1-continued

| Surface No. | Radius | Thickness | Glass |
|---|---|---|---|
| | AG = −7.75 × 10⁻² | Element Decenter DC = 0.0 | DF21 = 4.5 × 10⁻⁴ DF27 = −2.3 × 10⁻³ |
| Image | | | Air |

EXAMPLE 1. B

16 Degree Lens
EFL=3.0 mm
F/#=2.0

TABLE 2

| Surface No. | Radius | Thickness | Glass |
|---|---|---|---|
| Object | | Infinity | Air |
| 1 Aperture Stop | | 2.0 | BK7 |
| 2 | −1.602 | 3.0 | Air |
| 2 Aspheric Coeff. | k = −0.670 | Diffractive | DF3 = −4.8 × 10⁻⁴ |
| | AD = −7.0 × 10⁻³ | Coeff. | DF5 = −4.7 × 10⁻³ |
| | AE = 2.1 × 10⁻² | | DF10 = 1.4 × 10⁻² |
| | AF = −5.9 × 10⁻³ | | DF14 = −3.6 × 10⁻³ |
| | AG = 6.5 × 10⁻⁴ | | DF21 = −5.2 × 10⁻³ |
| | | Element Decenter DC = −0.513 | DF27 = 6.2 × 10⁻⁴ |
| Image | | | Air |

EXAMPLE 1. C

24 Degree Lens
EFL=3.0 mm
F/#=2.0

TABLE 3

| Surface No. | Radius | Thickness | Glass |
|---|---|---|---|
| Object | | Infinity | Air |
| 1 Aperture Stop | | 0.5 | BK7 |
| 2 | −1.509 | 0.391 | Air |
| Aspheric Coeff. | k = −0.570 | Diffractive | DF3 = 7.8 × 10⁻³ |
| | AD = 0.0 | Coeff. | DF5 = 5.2 × 10⁻³ |
| | AE = −4.6 × 10⁻³ | | DF10 = 1.0 × 10⁻² |
| | AF = 9.5 × 10⁻³ | | DF14 = −6.3 × 10⁻² |
| | AG = −1.2 × 10⁻³ | | DF21 = −2.9 × 10⁻³ |
| | AH = 1.4 × 10⁻⁴ | Element Decenter DC = −0.872 | DF27 = 7.3 × 10⁻⁴ |
| Image | | | Air | where the aspheric surface profile is defined by $$z(r) = \frac{cvr^2}{1 + \sqrt{1 - (k+1)cv^2r^2}} + ADr^4 + AEr^6 + AFr^8 + AGr^{10}$$

and the diffractive phase profile is defined as $$\phi(r) = \frac{2\pi}{\lambda_0}(DF_3x^2 + DF_5y^2 + DF_{10}x^4 + DF_{14}y^4 + DF_{21}x^6 + DF_{27}y^6)$$

where $\lambda_0$=546.1 nm.

EXAMPLE 2

Figure 18:
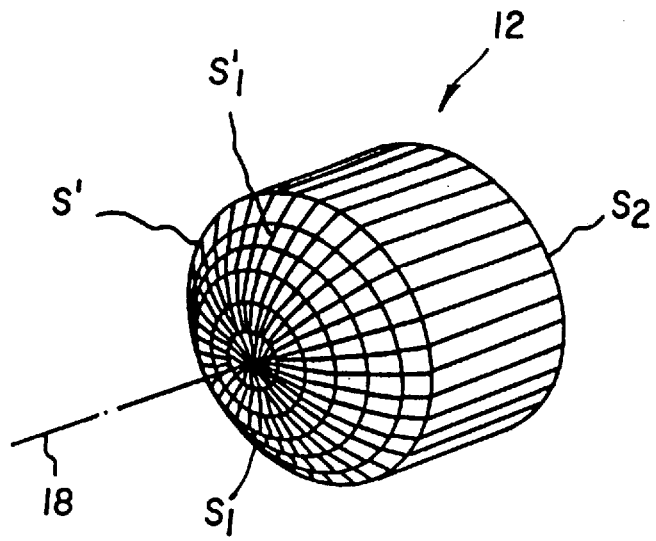
FIGS. 18 and 19 are a front and rear perspective view of a lenslet 12.
Figure 19:
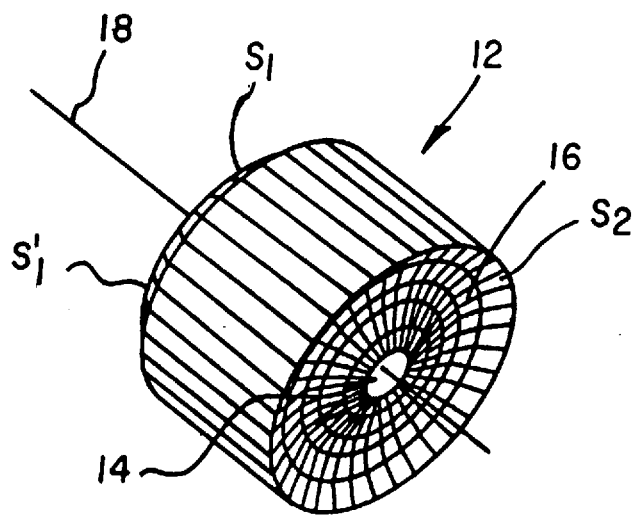

Referring to FIGS. 18 and 19, the first lenslet 12, 130 is one element of a first lenslet array 110 that is formed with a number of lenslets. Such an array may be used as a first lenslet array in the first, second or fourth lenslet array system embodiments, respectively. Each lenslet (12, 130) is formed with a diffractive pattern S' formed on a refractive, spherical surface $S_1$. Opposite the surface $S_1$ is a second surface $S_2$. Surface $S_2$ is an aspheric surface. The faceted surface of the diffractive pattern S' is seen more clearly in the cross-section of FIG. 20. At a radius $R_1$ the second surface $S_2$ is convex and transforms to a concave surface at the radius $R_2$ (where $R_2$ is larger than $R_1$). The second surface $S_2$ is defined by a polynomial asphere which exhibits an inflection at the radius $R_3$ (where $R_3$ is larger than $R_2$). Both the first and the second surfaces are substantially perpendicular to the optical axis 18 of the lenslet 12. The lenslet 12 may be formed as an epoxy replica via use of a quartz or a photoresist mask on a glass substrate, or be injection molded as a plastic part.

Figure 20:
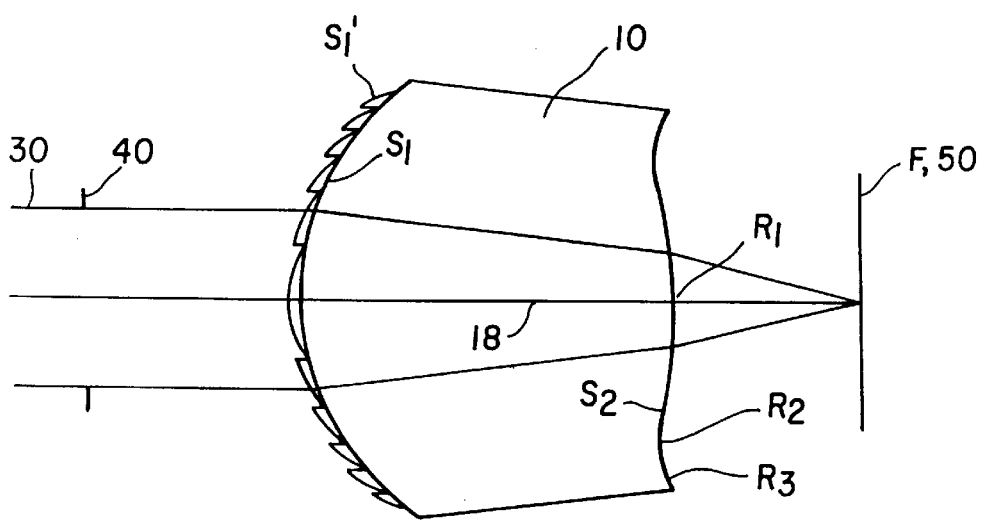
FIG. 20 is a sectioned view of the lenslet 12 of FIG. 19.

Referring to FIG. 20, incident light rays 30 pass through an aperture stop array 40 and are focused onto a focal plane ($F_1$ 50) by the lenslet 12, 130. The diffractive/refractive surface comprised of $S_1$ and S' corrects the chromatic aberrations and provides the majority of the focusing power while the aspheric surface $S_2$ provides for correction of field dependent aberrations such as petzval curvature, astigmatism, and coma. The lens has an F# of 2.0 and a FL of 3 mm, but generally could be from 1 mm to 5.0 mm.

Figure 21A:
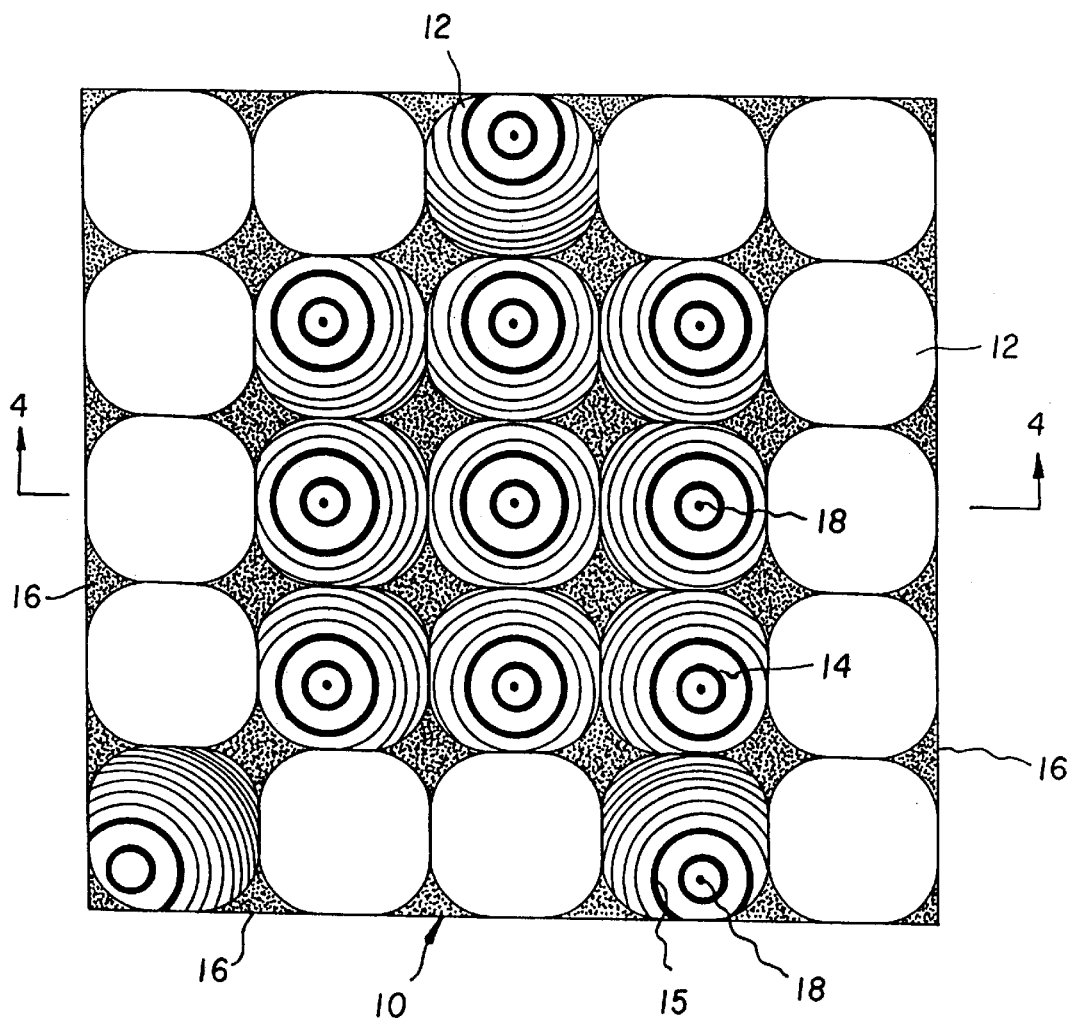
FIGS. 21A and 21B illustrates an aperture array positioned over a lenslet array with the spherical surface of each lenslet defined with topographical lines with the lenslets physical centers diverging with respect to centers of the image sections 135 (in FIG. 21A) and converging with respect to the centers of the image sections 135 (in FIG. 21B)
Figure 21B:
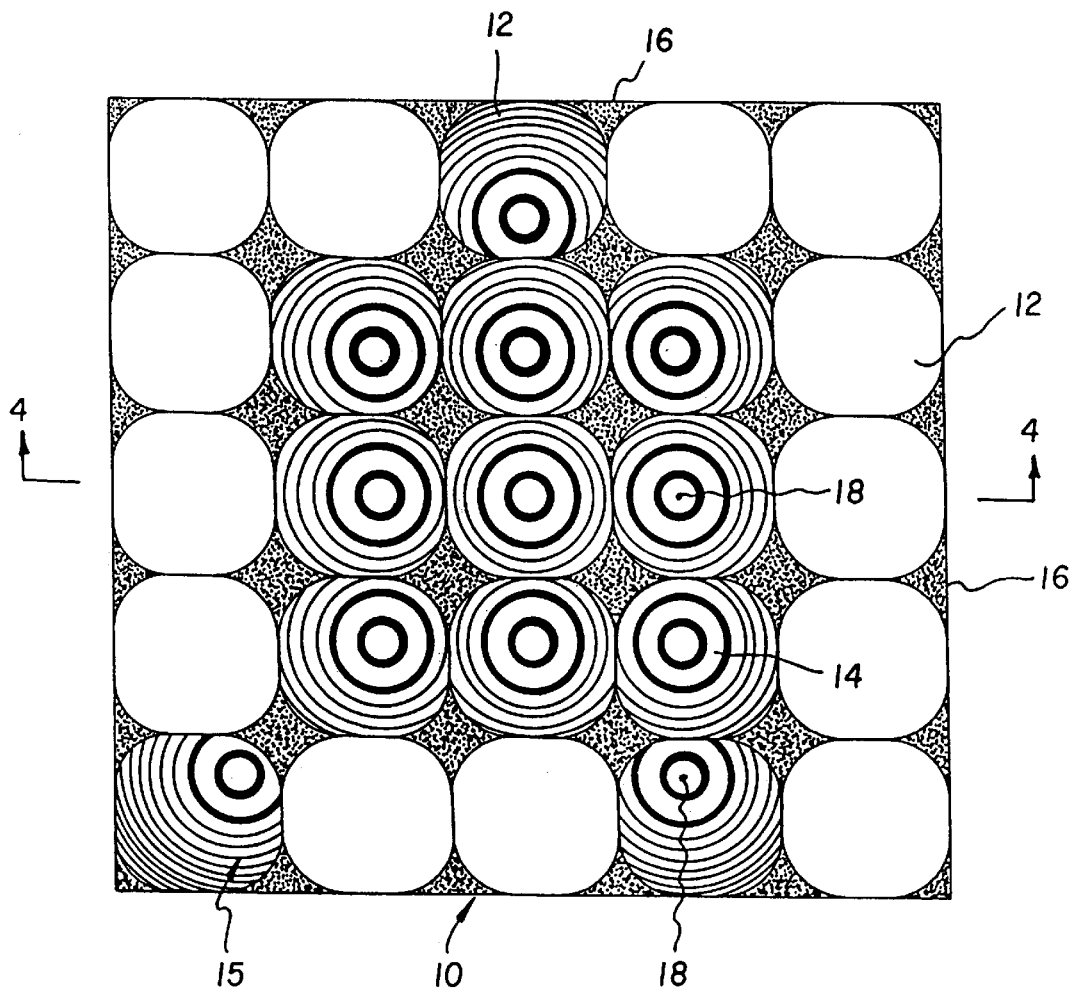

Referring now to FIGS. 21A and 21B, The individual lenslets 12 of FIGS. 20 and 21 are segmented and formed into a lenslet array 10. To be observed in FIGS. 21A and 21B is that the center of the optical axis 18 of each lenslet 12 is displaced outward as a function of its radial distance from the optical axis of the central lenslet while in FIG. 21B, the optical axes 18 are displaced inward. The lines 15 appearing around the optical axis 18 of each lenslet 12 are topographical lines generally indicating changes in height of the lenslet's surface. An array of opaque baffles 16 also serving as an aperture stop fills the areas between the lenslets 12 to prevent stray light from reaching further into the lenslet array system. The array depicted in FIGS. 21A and 21B represent only a small portion of an array that would be used in an actual camera. The optical axis of each lenslet, and in turn the lenslet itself is not aligned directly over its corresponding image section. Instead the lenslets are displaced so as to form image sections 135 at regularly spaced intervals on the intermediate image plane 136. Other configurations of the lenslets may be used such as forming the outer periphery of each lenslet as a square, hexagon, or circle, without detracting from the invention.

The reason that the invention uses only portions of the lenslets is that only a fraction of the lenslet is used for a particular angular field of view for an associated image section.

Figure 22:
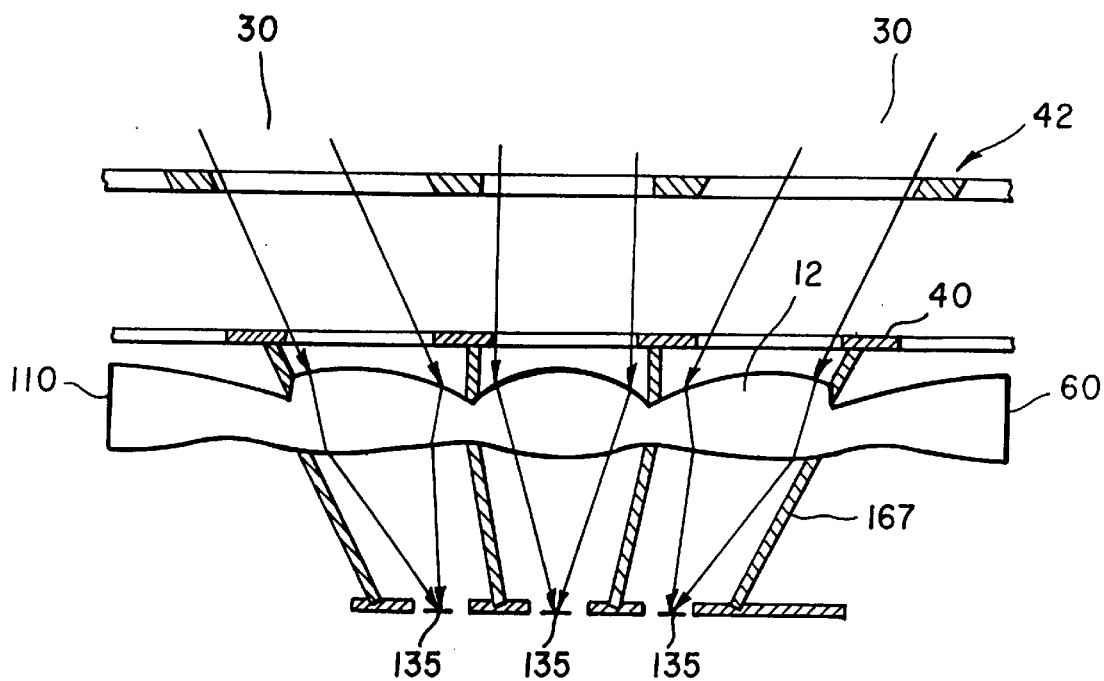
FIG. 22 illustrates, in a cross section view, a first lenslet array 110 having an array of field stops and an array of aperture stops positioned in front of this lenslet array.
Figure 23:
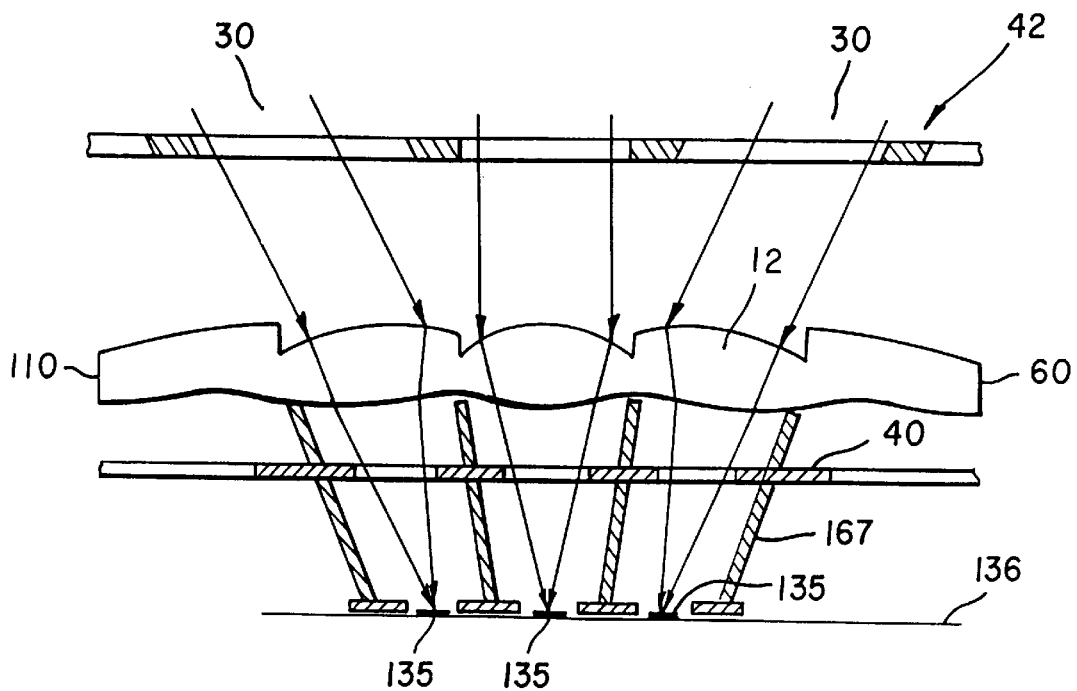
FIG. 23 illustrates, in a cross section view, a first lenslet array 110 having an array of field stops positioned in front of this lenslet array and an array of aperture stops positioned between the lenslet array 110 and the intermediate image plane 136.

FIG. 22 and 23 show cross-sections taken along the section line 4—4 in FIGS. 21A and 21B, illustrating the lenslet array 10, 110 positioned over the intermediate image plan and forming a number of image sections 135 corresponding in number to at least the number of lenslets forming the array 10, 110. The lenslet array 10, 110 is maintained a distance apart from the intermediate image plane by spacers 167 that also serve the function of being baffle walls. The aperture stop array 40 in combination with the baffle walls 167 and the field stop array 42 limit the field of view of associated with a particular image section so that it does not overlap the field of view of it neighbors by a large amount. The field stop array 42 is positioned approximately 0.5 mm to 2 mm from the surface of the lenslet array 10.

The center of the apertures in the aperture stop array and field stop array, 40 and 42, respectively are aligned to the center of the field of view of a corresponding lenslet. The spacing of the centers increases as a function of each lenslet's field angle from the center of the array causing the aperture stop array to be slightly larger than the associated lenslet array. The combination of the aperture stop array 40 with the field stop array 42 and a given lenslet focal length determines the field of each of the lenslets and the position of image sections on the intermediate image plane.

Figure 24A:
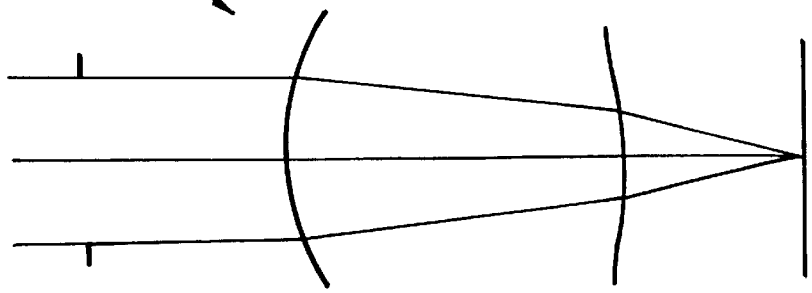
FIG. 24A, illustrates a cross section of the portion of a lenslet 10, 130 associated with a 0 degree field angle.
Figure 25A:
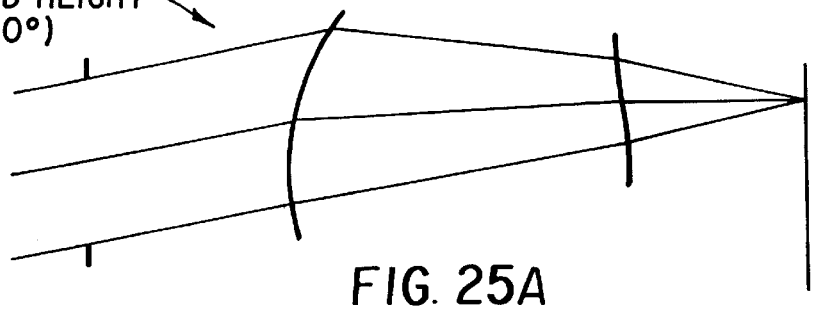
FIG. 25A, illustrates a cross section of the portion of a lenslet 10, 130 associated with a 14 degree field angle.
Figure 26A:
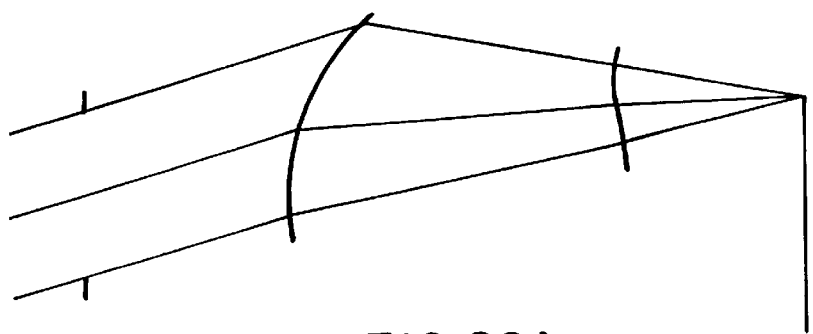
FIG. 26A, illustrates a cross section of the portion of a lenslet 10, 130 associated with a 20 degree field angle.
Figure 24B:
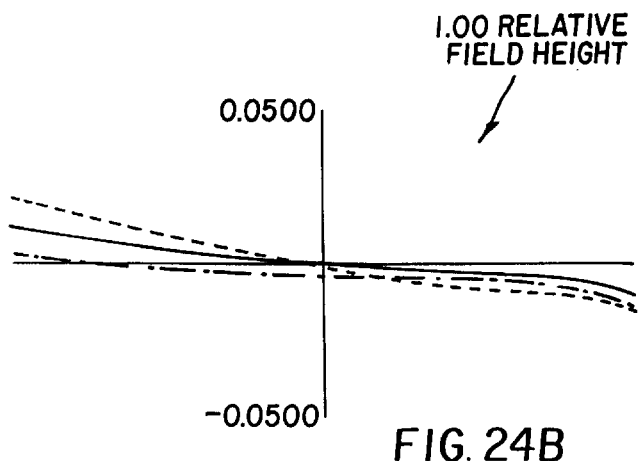
FIGS. 24B and 24C represent the tangential and saggital ray aberration curves for the lenslet illustrated in FIG. 24A.
Figure 24C:
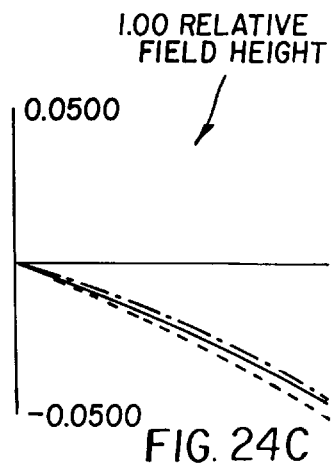
Figure 25B:
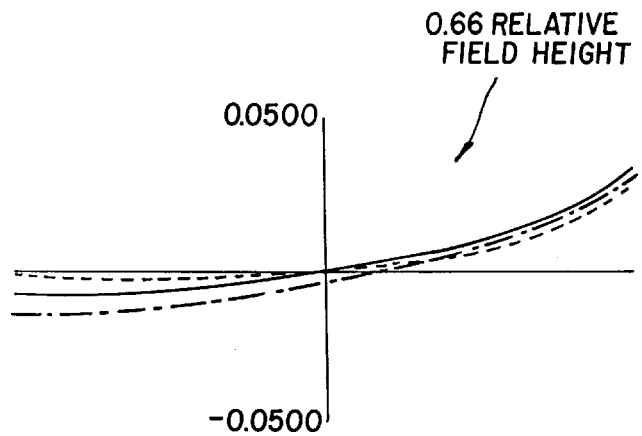
FIGS. 25B and 25C represent the tangential and saggital ray aberration curves for the lenslet illustrated in FIG. 25A.
Figure 25C:
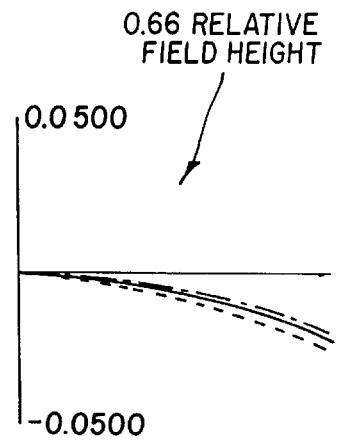
Figure 26B:
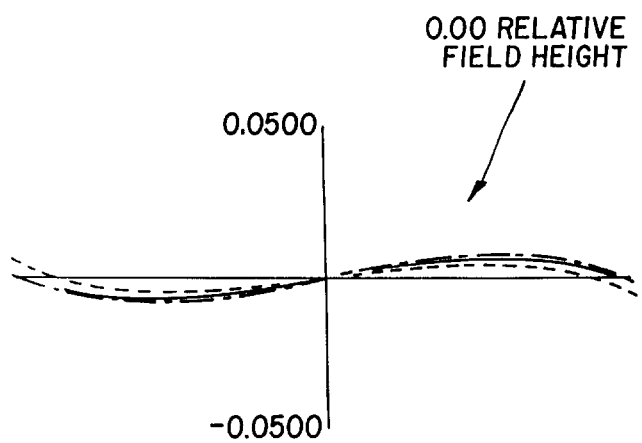
FIGS. 26B and 26C represent the tangential and saggital ray aberration curves for the lenslet illustrated in FIG. 26A.
Figure 26C:
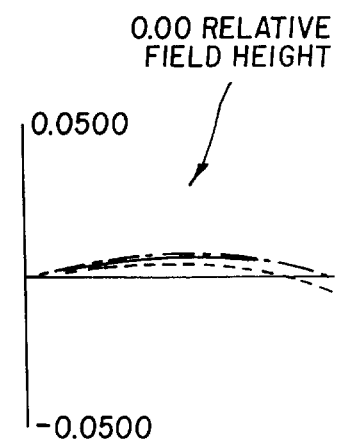

As stated above, an improved lenslet arrays including a diffractive/refractive hybrid lenslets is used to correct the chromatic aberration present due to use of a single refractive material. The diffractive lenslets 12 are shown in FIGS. 24A, 25A, and 26A, for the on-axis, 14 degrees, and full field of view. To be noted in a comparison of these figures is that the optical axis 18 is moving radially outwards as a function of field angle while the unit cell 14 is incident normal to the plane of the intermediate image plane 136. The opaque mask 16 acts as the aperture stop for the system as well as limiting the field of view of a given lenslet.

FIGS. 24B, 24C, 25B, 25C, 26B and 26C represent the tangential and saggital ray aberration curves for the respective lenslets. It is noteworthy that the overall spot size including chromatic aberration is approximately 30 micron. The solid lines represent a wavelength of 546.1 nm, the dotted lines represent a wavelength of 656.1 nm, and the dotted and dashed lines represent a wavelength of 460.0 nm which represent light in the green, red, and blue, wavelengths.

The following table lists the optical design parameters for centrally located lenslet.

EFL=0.5 mm
F/#=2.0

TABLE 4

| Surface No. | Radius | Thickness | Glass |
|---|---|---|---|
| Object | | Infinity | Air |
| 1 Aperture Stop | Infinity | 0.9083 | Air |
| 2 | 2.805 | 2.9999 | BK7 |
| | | Diffractive Coefficients | $DF1 = 1.058410^{-2}$ $DF2 = 9.572 \times 10^{-4}$ |
| 3 | -2.417 | 1.704 | Air |
| Aspheric Coefficients | $AD = 0.3245 \times 10^{-1}$ $AE = 0.4534 \times 10^{-2}$ | | |
| Image | | | Air |

As stated above, the aspheric surface profile is defined by equation (1)

$$z(r) = \frac{cvr^2}{1 + \sqrt{1 - (k+1)cv^2 r^2}} + ADr^4 + AEr^6 + AFr^8 + AGr^{10}$$

The diffractive phase profile rotationally symmetric and is defined as $$\phi(r) = \frac{2\pi}{\lambda_0} (DF_1 r^2 + DF_2 r^4 + DF_3 r^6 + DF_4 r^8 + DF_5 r^{10}) \quad \text{equation (3)}$$

where
$\lambda_0 = 546.1$ nm
2. The Relay lenslet array

Figure 3:
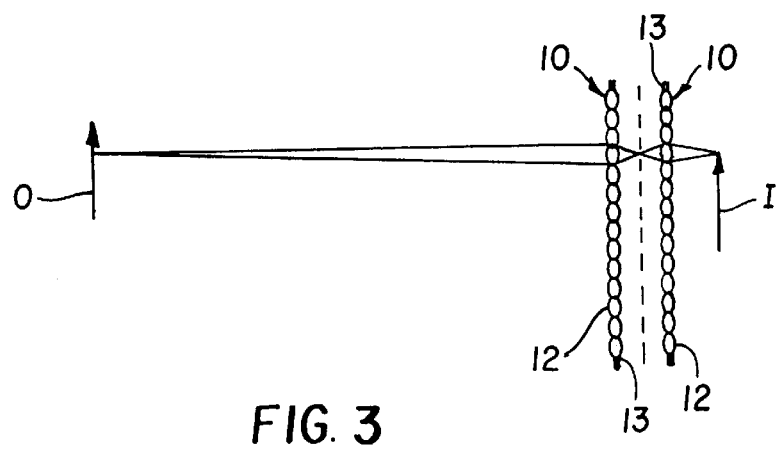
FIG. 3 schematically illustrates an exemplary lenslet array system of the present invention.
Figure 27:
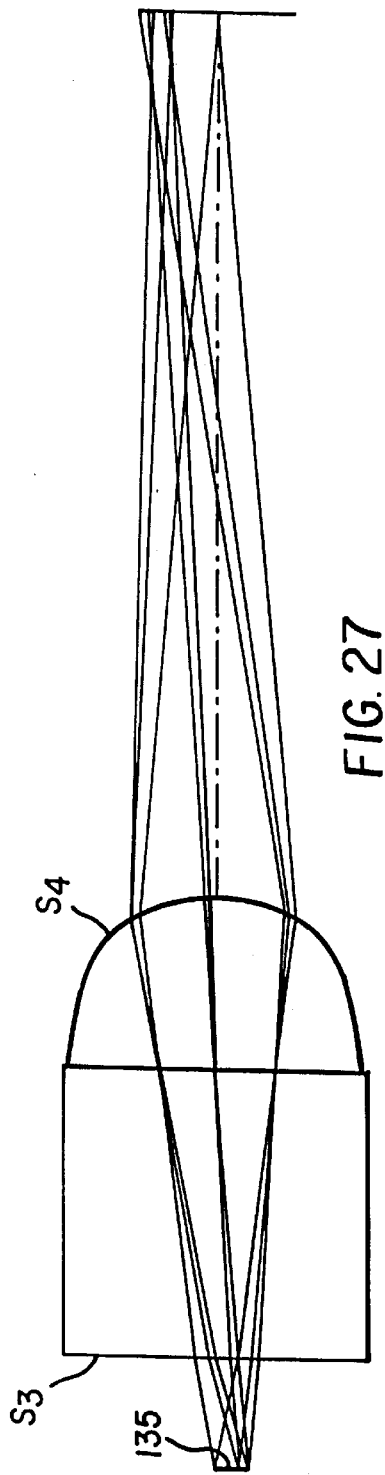
FIG. 27, illustrates a cross section of a centrally located lenslet 10, 140 used in a reimaging lenslet array.

Referring to FIG. 3 and 4 a relay lenslet array 10 is formed with an array of refractive lenslets 12. Such an array may be used as second (reimaging) lenslet array 120. In this example the lenslets are formed of glass. They have an effective focal length if 0.5 mm. The following table lists the optical design parameters for a centrally located lenslet comprising array 120. This lenslet is illustrated in FIG. 27.

TABLE 5

| Surface No. | Radius | Thickness | Glass |
|---|---|---|---|
| Object | | 0.19 | Air |
| 1 | infinity | 0.8 | BK7 |
| 2 Aperture Stop | −0.25936* | 1.548 | AIR |
| Aspheric Coeff. | k = 0.0 | | |
| | AD = −0.332E + 01 | | |
| | AE = 0.833E + 03 | | |
| | AF = −0.216E + 05 | | |
| | AG = 0.67373E + 05 | | |
| Image | | | Air |

*Aspheric surface. The aspheric surface profile is defined by equation 1 listed above.

3. A lenslet array system incorporating an integral field lens/reimager array.

Figure 28:
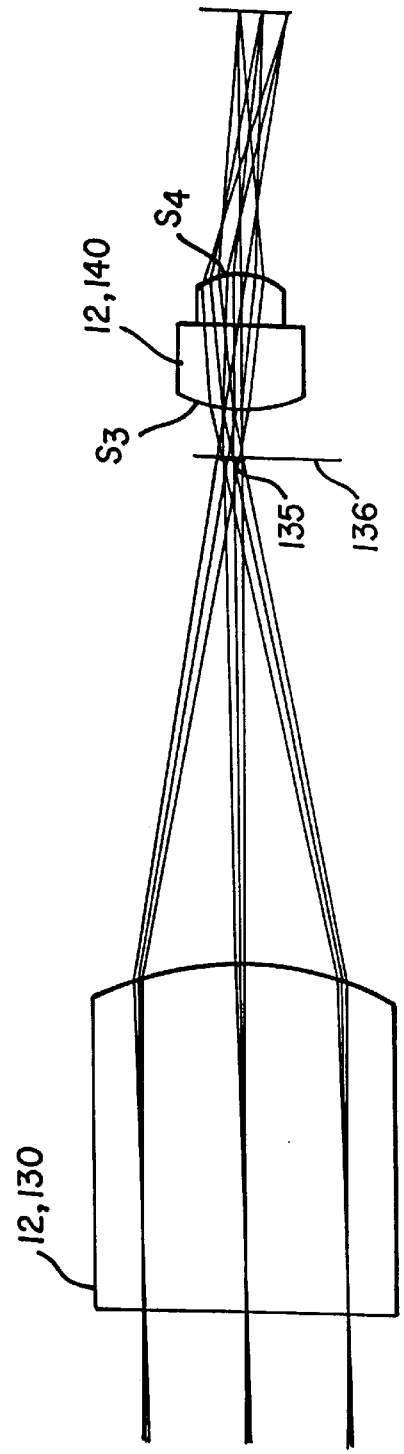
FIG. 28, illustrates a small part of a lenslet array system incorporating an integral field lens reimager array.

A lenslet array system such as the lenslet array system 300 shown in FIGS. 10 and 12 includes a first, imaging lenslet array 110 having a plurality of lenslets 130 and a second lenslet array 120 having a plurality of lenslets 140. The second lenslet array 120 of the third lenslet array system embodiment 300 is an integral field lens/reimager lenslet array. This array 120 may be formed with an array of achromatized refractive/diffractive lenslets 12, 140 or refractive lenslets. The lenslet array system 300 is described in the "lenslet array system description" section of this application. As can be seen from the drawing (FIG. 19) the front (object side) surface S3 of the lenslets 12 of the integral field lens/reimager lenslet array lenslet array 120 is convex and is located close to the intermediate image plane 136. The surface $S_3$ performs the function of the field lens. It is preferred that the front surface $S_3$ of these lenslets be slightly spaced (about 1 mm or less) from the intermediate image plane so that the dust particles or surface scratches located at the surface $S_3$ would not get reimaged onto the final image plane 136. In this example the front surface $S_3$ of the reimaging lenslets 12 of the second lenslet array is located 0.19 mm away from the intermediate image plane. Surface $S_4$ of the lenslet 140 performs (primarily) the relaying function i.e. it has positive optical power and is used to reimage an image section 135 on to the final image plane 136. The following table lists the optical design parameters for the lenslets shown in FIG. 28. It is noted the lenslets 12 of the second lenslet array do not have to be abutting one another.

TABLE 6

| Surface No. | Radius | Thickness | Glass | | |
|---|---|---|---|---|---|
| Object | | | Air | | |
| 1, Aperture Stop | infinity | 2.0 | BK7 | | |
| 2.* | −1.657 | 3.0 | Air | | |
| Aspheric Coeff.: | k = 1.0175 | | Diffractive Coeff.: | DF3 = −1.002E − 02 | |
| | AD = 1.0159E − 01 | | | DF5 = −1.029E − 02 | |
| | AE = −8.4538E − 02 | | | DF10 = −1.813E − 03 | |
| | AF = 2.5147E − 01 | | | DF14 = 1.6915E − 04 | |
| | AG = −1.9531E − 01 | | | DF21 = 3.389E − 03 | |
| | | | | DF27 = 2.345E − 04 | |
| 3 | 0.1E12 | 0.19 | air | | |
| 4 | infinity | 0.5 | BK7 | | |
| 5 | infinity | 0.3 | BK7 | | |
| 6 | −0.25936 | 1.547895 | air | | |
| Aspheric Coeff.: | k = 0.0 | | | | |
| | AD = 0.126E + 02 | | | | |
| | AE = 0.1688E + 01 | | | | |

TABLE 6-continued

| Surface No. | Radius | Thickness | Glass |
|---|---|---|---|
| | AF = 0.7923E + 03 | | |
| | AG = 0.16542E + 05 | | |
| Image | | | Air |

*Surface 2 is an aspheric surface with a diffractive pattern which is formed on this aspheric surface. Surface 2 is a rationally symmetric surface. Its profile is defined by the equation 1

The invention has been described with reference to a preferred embodiment. However, it will be appreciated that variations and modifications can be effected by a person of ordinary skill in the art without departing from the scope of the invention.

What is claimed is:

1. A lenslet array system for imaging an associated object onto a final image surface, said lenslet array system comprising:
   (i) a first assembly including a field-limiting mask and a first lenslet array having an associated focal plane, said lenslet array accepting a full field of view in excess of 20 degrees and forming a plurality of non-contiguous image sections of the associated object at an intermediate image plane which is substantially coplanar with the focal plane associated with said first lenslet array, said first lenslet array including a plurality of positive power lenslets abutting one another, each of said plurality of lenslets having a focal length $f_1$ of less than 15 mm and accepting a unique segment of the full field of view subtended by the associated object, where these segments of the full field of view together comprise the full field of view, and each of said lenslets forming one image section corresponding to its segment of the full field of view; and
   (ii) a second assembly including a second lenslet array accepting light from said first assembly, said second lenslet array having a plurality of positive power lenslets abutting one another, each of said lenslets of said second lenslet array (a) having a focal length $f_2$ which is less than 15 mm, (b) reimaging one of said image sections located at said intermediate image plane and creating an inverted image of said image section on the final image surface, and (c) together with other lenslets of said second lenslet array creating a single image of the associated object.

2. A lenslet array system according to claim 1 wherein said focal length $f_2$ is smaller than said focal length $f_1$ and the single image is a continuous image.

3. A lenslet array system according to claim 2 wherein said first lenslet array and said second lenslet array in combination provide a lenslet array system having a total length of less than 17 millimeters.

4. A lenslet array system according to claim 2 wherein said first lenslet array and said second lenslet array in combination provide a lenslet array system having a total length of less than 12 millimeters.

5. A lenslet array system according to claim 2 wherein said first lenslet array has a focal length of less than 7 mm, and said first lenslet array and said second lenslet array in combination provide a lenslet array system having a total length of less than 8 millimeters.

6. A lenslet array system according to claim 2 further satisfying the following equation:

$$1.0 < f_1/f_2 < 7.0.$$

7. A lenslet array system according to claim 2 wherein said intermediate image plane is spaced less than 5% of $f_1$ from said associated focal plane.

8. A lenslet array system according to claim 3 wherein said intermediate image plane is spaced less than 5% of $f_1$ from said associated focal plane.

9. A lenslet array system according to claim 6 wherein said intermediate image plane is spaced less than 5% of $f_1$ from said associated focal plane.

10. A lenslet array system according to claim 3 wherein said intermediate image plane is spaced less than 0.025 times $f_1$ from said associated focal plane.

11. A lenslet array system according to claim 2, wherein said segment of the full field of view is less than 5 degrees.

12. A lenslet array system according to claim 3, wherein said segment of the full field of view is less than 2 degrees.

13. A lenslet array system according to claim 6, wherein said segment of the full field of view is less than 2 degrees.

14. A lenslet array system according to claim 9, wherein said segment of the full field of view is less than 2 degrees.

15. A lenslet array system according to claim 2, wherein each of said arrays comprises more than 100 lenslets.

16. A lenslet array system according to claim 6, wherein each of said arrays comprises more than 100 lenslets.

17. A lenslet array system according to claim 7, wherein each of said arrays comprises more than 1000 lenslets.

18. A lenslet array system according to claim 2 wherein said lenslets have an aspherical surface.

19. A lenslet array system according to claim 2 wherein each of said lenslets on at least one of said lenslet arrays is a diffractive/refractive hybrid to eliminate chromatic aberration.

20. A lenslet array system according to claim 2 further including a third lenslet array located in a vicinity of said intermediate image plane and positioned between said first lenslet array and second lenslet array, said third lenslet array comprising a plurality of lenslets.

21. A lenslet array system according to claim 20 wherein said third lenslet array is positioned within 5% of $f_1$ from said associated focal plane of said first array and each of said lenslets of said third lenslet array (a) has an optical axis, and (b) bends field rays towards this optical axis, thereby functioning as a field lens.

22. A lenslet array system according to claim 20 wherein said third lenslet array is positioned within 2.5% of $f_1$ from said associated focal plane of said first array and each of said lenslets of said third lenslet array (a) has an optical axis, and (b) bends field rays towards this optical axis, thereby functioning as a field lens.

23. A lenslet array system according to claim 2 wherein said mask is comprised of at least one aperture plate having a plurality of apertures, each of said apertures having a center, where each of the centers of the apertures are positioned to lie along the optical axis of a respective first array's lenslets optical axis.

24. A camera comprising:
a lenslet array system according of claim 2;
a camera body at least partially enclosing said lenslet array system; and
a photosensitive surface located at said final image surface and enclosed within said camera body.

25. A camera according to claim 24 wherein said photosensitive surface is a CCD array.

26. A camera according to claim 24 wherein said photosensitive surface is photographic film.

27. A lenslet array system for imaging an associated object onto a final image surface, said lenslet array system comprising in order from an object side:

(i) a first assembly comprising a field-limiting mask and a first lenslet array having an associated focal plane, said lenslet array accepting a full field of view in excess of 20 degrees, said lenslet array forming a plurality of image sections of the associated object of an intermediate image plane substantially coplanar with the focal plane associated with said first lenslet array, said first lenslet array including a substrate and a plurality of positive power lenslets located on said substrate, said first lenslet array including a substrate and a plurality of positive power lenslets located on said substrate and abutting one another each of said plurality of lenslets having a focal length $f_1$ of less than 15 mm and accepting a different segment of the full field of view subtended by the associated object, where these segments of the full field of view together comprise the full field of view, and each of said lenslets forming one image section corresponding to its segment of the full view; and (ii) a second lenslet array accepting light from said first lenslet array/mask assembly, said second lenslet array having a plurality of positive power lenslets abutting one another, each of said lenslets of said second lenslet array having a focal length $f_2$ which is smaller than focal length $f_1$ of said lenslets of said first lenslet array, each of said lenslets of said second lenslet array creating an inverted image of one of said non-contiguous image sections located at said intermediate image plane onto a final image surface, and together with other lenslets of said second lenslet array creating a continuous image of the associated object.

28. A lenslet array system according to claim 27 wherein said first lenslet array is spaced from said second lenslet array.

29. A lenslet array system according to claim 28 wherein $f_1 < 10.0$ mm.

30. A lenslet array system according to claim 29 wherein $f_1 < 7.0$ mm.

31. A lenslet array system according to claim 29 wherein said second lenslet array is located equal to or larger than 1.2 $f_2$ from the intermediate image plane.

* * * * *